(12) United States Patent
Aisu et al.

(10) Patent No.: US 10,298,869 B2
(45) Date of Patent: May 21, 2019

(54) PHOTOELECTRIC CONVERSION DEVICE AND IMAGE GENERATION DEVICE

(71) Applicants: Katsuhiko Aisu, Hyogo (JP); Yasukazu Nakatani, Hyogo (JP); Kazuhiro Yoneda, Osaka (JP); Takaaki Negoro, Osaka (JP); Yoshinori Ueda, Hyogo (JP); Katsuyuki Sakurano, Hyogo (JP)

(72) Inventors: Katsuhiko Aisu, Hyogo (JP); Yasukazu Nakatani, Hyogo (JP); Kazuhiro Yoneda, Osaka (JP); Takaaki Negoro, Osaka (JP); Yoshinori Ueda, Hyogo (JP); Katsuyuki Sakurano, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 30 days.

(21) Appl. No.: 15/187,957

(22) Filed: Jun. 21, 2016

(65) Prior Publication Data
US 2017/0006246 A1   Jan. 5, 2017

(30) Foreign Application Priority Data

Jun. 30, 2015 (JP) .................................. 2015-131277

(51) Int. Cl.
*H01L 31/11* (2006.01)
*H04N 5/378* (2011.01)
(Continued)

(52) U.S. Cl.
CPC ....... *H04N 5/378* (2013.01); *H01L 27/14601* (2013.01); *H04N 5/2253* (2013.01);
(Continued)

(58) Field of Classification Search
None
See application file for complete search history.

(56) References Cited

U.S. PATENT DOCUMENTS 4,107,721 A * 8/1978 Miller .................... H01L 31/111
257/462
5,146,074 A    9/1992 Kawahara et al.
(Continued)

FOREIGN PATENT DOCUMENTS

EP    0472066 A1    2/1992
JP    H04-048862    2/1992
(Continued)

OTHER PUBLICATIONS

European search report dated Nov. 22, 2016 in corresponding European Patent Application No. 16176440.2.
(Continued)

*Primary Examiner* — Twyler L Haskins
*Assistant Examiner* — Wesley J Chiu
(74) *Attorney, Agent, or Firm* — Cooper & Dunham LLP

(57) ABSTRACT

A photoelectric conversion device includes a photoelectric conversion unit which includes a phototransistor having a collector region, an emitter region, and a base region to generate an output current according to an intensity of incident light to the phototransistor, and a base potential setting unit which is configured to set up a base potential of the phototransistor so that the output current from the photoelectric conversion unit is equal to a predetermined current value.

9 Claims, 22 Drawing Sheets

(51) Int. Cl.
    *H04N 5/363*    (2011.01)
    *H04N 5/374*    (2011.01)
    *H01L 27/146*   (2006.01)
    *H04N 5/225*    (2006.01)

(52) U.S. Cl.
    CPC ............. *H04N 5/363* (2013.01); *H04N 5/374* (2013.01); *H01L 31/1105* (2013.01)

(56) References Cited

U.S. PATENT DOCUMENTS

| | | | | |
|---|---|---|---|---|
| 5,461,425 | A * | 10/1995 | Fowler ................... | H04N 3/155 250/208.1 |
| 6,538,693 | B1 * | 3/2003 | Kozuka .................. | H04N 5/363 348/241 |
| 7,391,004 | B2 * | 6/2008 | Takashima ............. | H04N 3/155 250/208.1 |
| 9,142,579 | B2 | 9/2015 | Hayashi et al. | |
| 9,197,220 | B2 | 11/2015 | Hayashi et al. | |
| 2001/0015404 | A1 * | 8/2001 | Takada ................... | H04N 3/155 250/208.1 |
| 2007/0019091 | A1 * | 1/2007 | Muramatsu ......... | H03M 1/1019 348/308 |
| 2010/0039547 | A1 * | 2/2010 | Kinugasa .................. | G01J 1/18 348/308 |
| 2011/0215224 | A1 * | 9/2011 | Kobayashi ................ | G01J 1/42 250/208.2 |
| 2014/0367550 | A1 | 12/2014 | Aisu et al. | |

FOREIGN PATENT DOCUMENTS

| | | |
|---|---|---|
| JP | H05-275671 | 10/1993 |
| JP | H06-022221 | 1/1994 |
| JP | 09-233259 | 9/1997 |
| JP | 2000-295534 | 10/2000 |
| JP | 2012-124835 | 6/2012 |
| JP | 5674096 | 2/2015 |

OTHER PUBLICATIONS

Steve Hung-Lung Tu et al. "CMOS Image Sensors Using Feedback Reset Circuits for High Speed Operation", Fu Jen Catholic University, May 2006.

Yoshio Nakamura et al. "Design of Bipolar Imaging Device (BASIS)", IEEE Transactions on Electron Devices, vol. 38, No. 5, May 1991, pp. 1028-1036.

Office Action dated Apr. 9, 2019 in Japanese Patent Application No. 2015-131277, citing documents AO-AQ therein, 4 pages.

* cited by examiner

PHOTOELECTRIC CONVERSION DEVICE AND IMAGE GENERATION DEVICE

CROSS-REFERENCE TO RELATED APPLICATION

The present application is based upon and claims the benefit of priority of Japanese Patent Application No. 2015-131277, filed on Jun. 30, 2015, the contents of which are incorporated by reference in their entirety.

BACKGROUND OF THE INVENTION

1. Field of the Invention

The present disclosure relates to a photoelectric conversion device and an image generation device.

2. Description of the Related Art

Conventionally, a photoelectric conversion cell utilizing a phototransistor having a photocurrent amplification function is known as a photoelectric transducer. For example, see Japanese Patent No. 5674096. In this photoelectric conversion cell, a process to discharge (reset) electric charge accumulated in the phototransistor thereof is performed by discharging (resetting) the electric charge accumulated in the phototransistor upon reading of the photoelectric conversion cell.

However, the photoelectric conversion cell may have a difficulty in fully resetting the electric charge accumulated in the phototransistor within a predetermined reading time when intense optical energy is received, or when an extended accumulation time is required.

SUMMARY OF THE INVENTION

In one aspect, the present disclosure provides a photoelectric conversion device capable of reducing the time needed to reset the electric charge accumulated in the phototransistor.

In one embodiment, the present disclosure provides a photoelectric conversion device which includes a photoelectric conversion unit which has a collector region, an emitter region, and a base region, and includes a phototransistor to generate an output current according to an intensity of incident light to the phototransistor, and a base potential setting unit which is configured to set up a base potential of the phototransistor so that the output current from the photoelectric conversion unit is equal to a predetermined current value.

The object and advantages of the invention will be realized and attained by means of the elements and combinations particularly pointed out in the claims. It is to be understood that both the foregoing general description and the following detailed description are exemplary and explanatory and are not restrictive of the invention as claimed.

DETAILED DESCRIPTION OF THE PREFERRED EMBODIMENTS

A description will be given of embodiments with reference to the accompanying drawings.

First Embodiment

Figure 1:
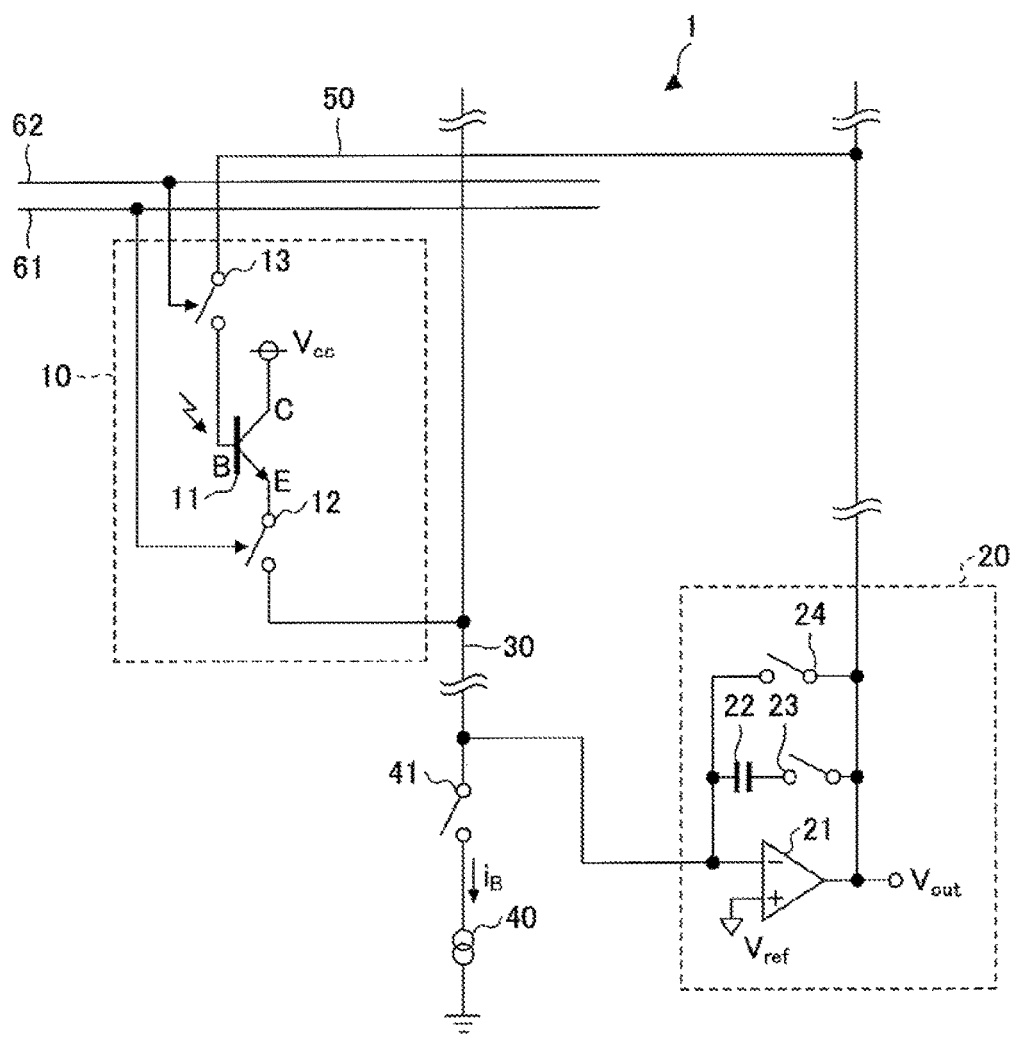
FIG. 1 is an equivalent circuit diagram illustrating a photoelectric conversion device according to a first embodiment.

First, a configuration of a photoelectric conversion device 1 according to a first embodiment will be described. FIG. 1 is an equivalent circuit diagram illustrating the photoelectric conversion device 1 according to the first embodiment.

As illustrated in FIG. 1, the photoelectric conversion device 1 includes a pixel cell 10, an integrator 20 disposed for the pixel cell 10, an output line 30 disposed as a path for reading signal charge, a constant current source 40 disposed to branch OFF from a path of the output line 30, and a reset line 50 disposed to connect the pixel cell 10 and an output of the integrator 20.

The pixel cell 10 is an example of a photoelectric conversion unit, and the above-described configuration including the integrator 20, the output line 30, the constant current source 40, and the reset line 50 is an example of a base potential setting unit.

The pixel cell 10 includes a voltage source $V_{cc}$, a phototransistor 11, a cell select switch 12 (which is disposed as a signal charge reading unit), and a cell reset switch 13.

The phototransistor 11 has a bipolar structure including a collector region C, an emitter region E, and a base region B. The phototransistor 11 generates an output current according to an intensity of incident light to the phototransistor 11.

The collector region C is connected to the voltage source $V_{cc}$.

The emitter region E is connected to the cell select switch 12. When the cell select switch 12 is turned ON, the emitter region E of the phototransistor 11 is connected to the output line 30 via the cell select switch 12. The integrator 20 is connected to the output line 30, and the signal charge from the emitter region E is transferred to the integrator 20.

The base region B is connected to the cell reset switch 13. When the cell reset switch 13 is turned ON, the base region B is connected to the reset line 50 via the cell reset switch 13. The output of the integrator 20 is connected to the reset line 50, and the output of the integrator 20 is supplied to the base region B.

The integrator 20 is disposed to the output line 30 from which a photocurrent output from the phototransistor 11 is received. The integrator 20 is configured to perform an integration process of the photocurrent output from the phototransistor 11. In the integration process, the electric charge according to the photocurrent is accumulated within a reading time, the accumulated charge is converted into a voltage, and the voltage is output from the integrator 20. The integrator 20 includes an operational amplifier 21, a capacitor 22, an integration capacitor connect switch 23, and an integrator reset switch 24.

The integration capacitor connect switch 23 may be a switch configured to connect the capacitor 22 to the operational amplifier 21 and disconnect the connector 22 from the operational amplifier 21. The integrator reset switch 24 may be a switch configured to discharge the signal charge accumulated in the capacitor 22 (or configured to perform an integrator reset process).

The constant current source 40 is connected via the constant current source connect switch 41 to the output line 30 which outputs the photocurrent from the phototransistor 11.

Figure 2:
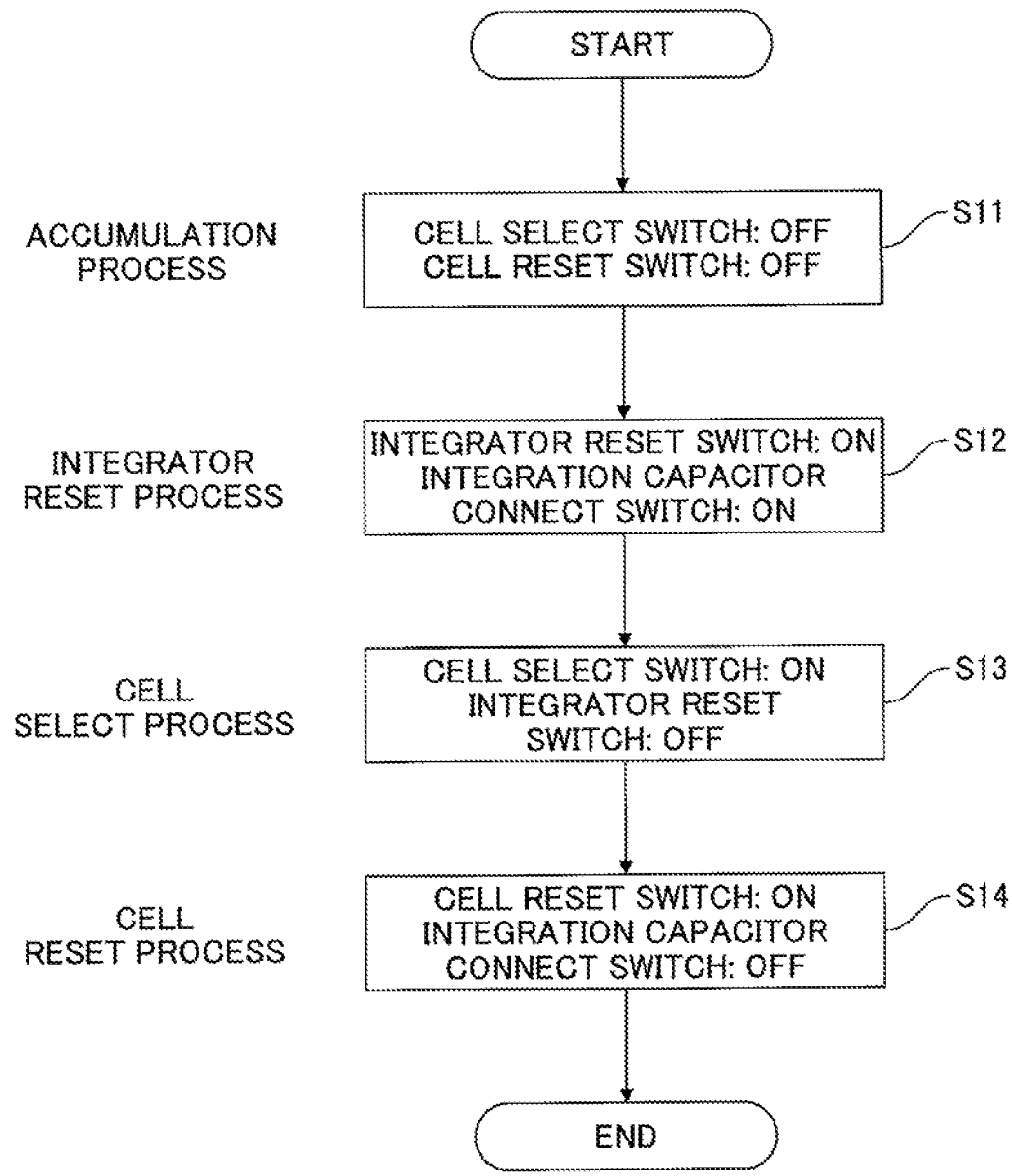
FIG. 2 is a flowchart for explaining operation of the photoelectric conversion device according to the first embodiment.

Next, an example of operation of the photoelectric conversion device 1 according to the first embodiment will be described. FIG. 2 is a flowchart for explaining operation of the photoelectric conversion device 1 according to the first embodiment. FIGS. 3 to 6 are diagrams illustrating various states of the photoelectric conversion device 1 according to the first embodiment when performing various processes.

Upon reception of instructions from a control unit (not illustrated) via control lines 61 and 62, the photoelectric conversion device 1 performs the processes of steps S11 to S14 as illustrated in FIG. 2.

Figure 3:
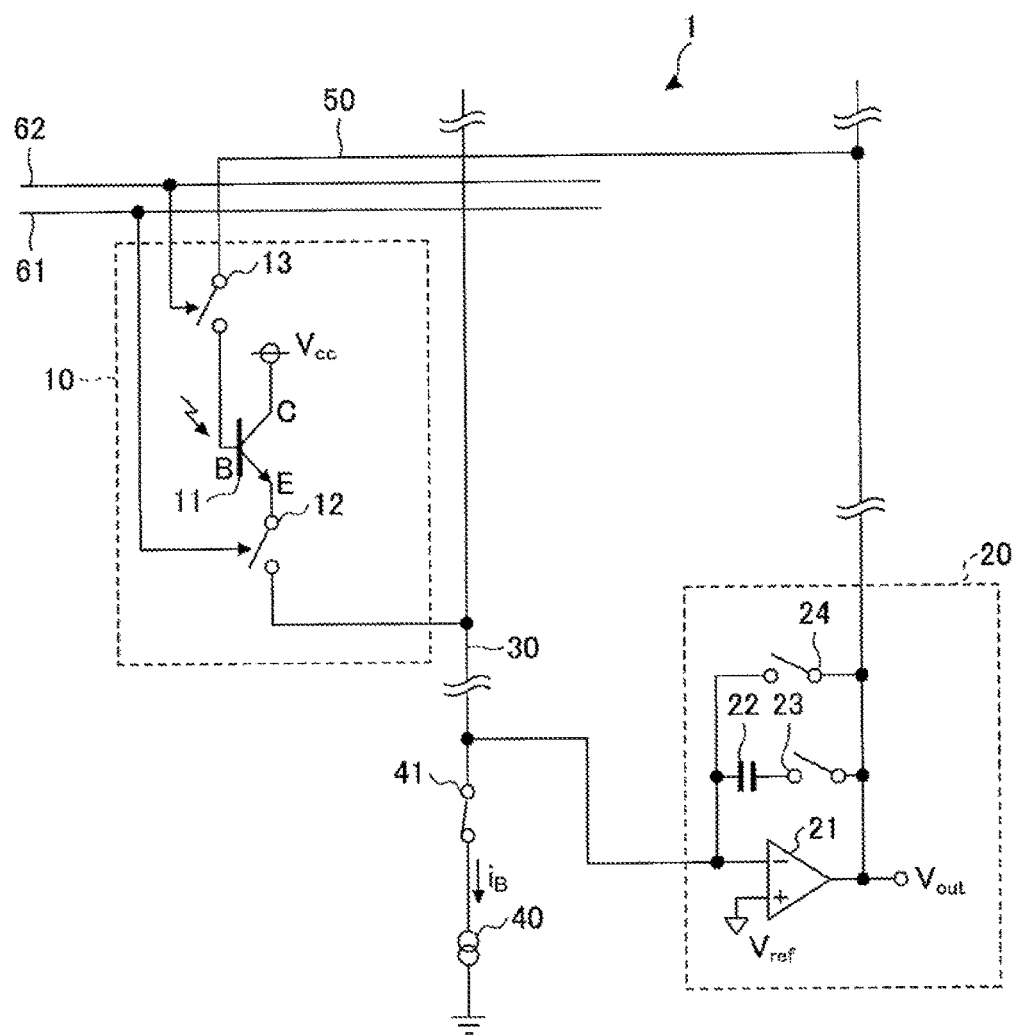
FIG. 3 is a diagram illustrating a state of the photoelectric conversion device according to the first embodiment when performing an accumulation process.

First, the photoelectric conversion device 1 performs an accumulation process to accumulate signal charge in the phototransistor 11. Specifically, the cell select switch 12 is turned OFF and the cell reset switch 13 is turned OFF (step S11). At this time, in the photoelectric conversion device 1, as illustrated in FIG. 3, the cell select switch 12 is in an OFF state and the cell reset switch 13 is in an OFF state. Note that the integration capacitor connect switch 23, the integrator reset switch 24, and the constant current source connect switch 41 may be in an ON state or in an OFF state. In the phototransistor 11, upon reception of incident optical energy, the optical energy is converted into signal charge, and the signal charge is accumulated in the base region B. In this condition, the emitter region E and the base region B of the phototransistor 11 in the pixel cell 10 are in a floating state. Hence, the signal charge generated according to the optical energy is accumulated in the base region B, starting from a base potential set up by a cell reset process (which will be described later), and a base-to-collector voltage $V_{BC}$ of the phototransistor 11 is reduced.

Figure 4:
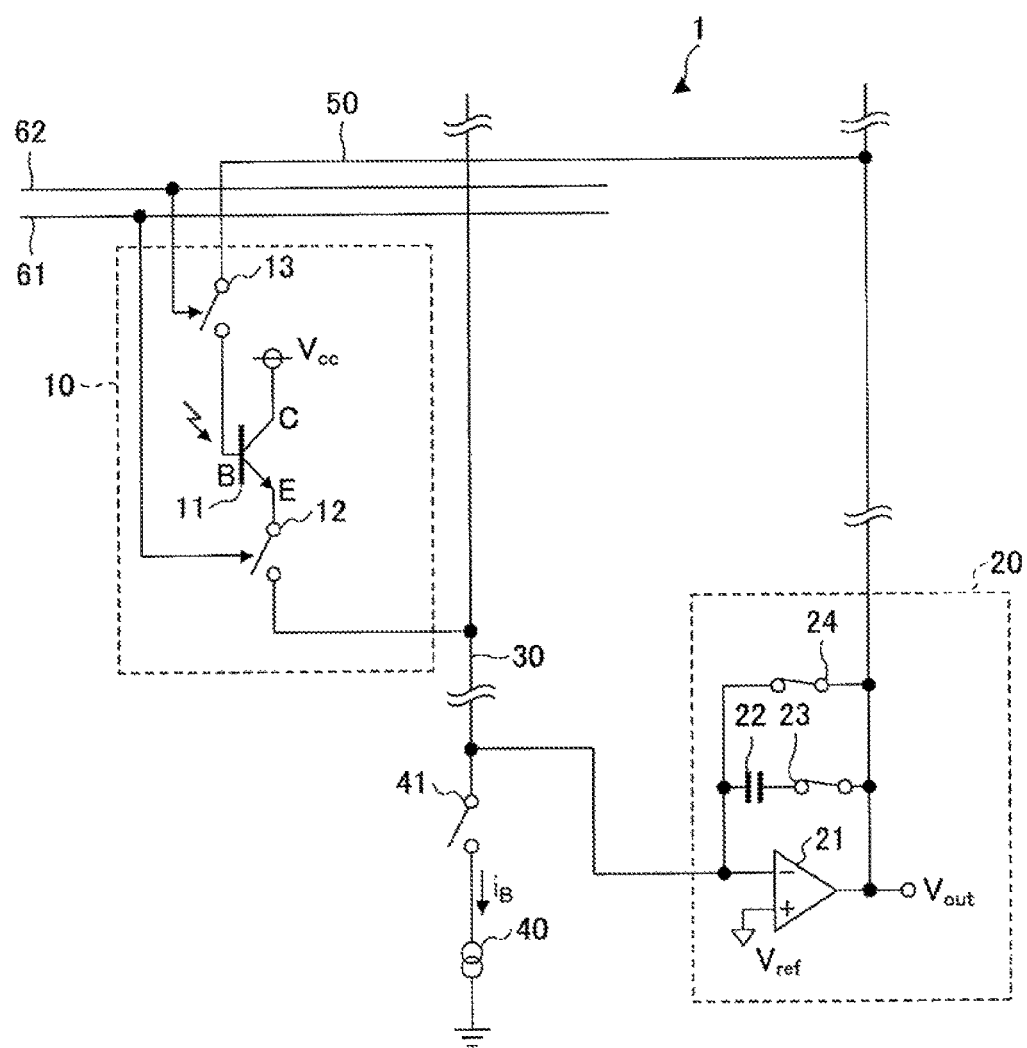
FIG. 4 is a diagram illustrating a state of the photoelectric conversion device according to the first embodiment when performing an integrator reset process.

Subsequently, the photoelectric conversion device 1 performs an integrator reset process to discharge the signal charge in the capacitor 22 of the integrator 20. Specifically, the integrator reset switch 24 is turned ON and the integration capacitor connect switch 23 is turned ON (step S12). At this time, in the photoelectric conversion device 1, as illustrated in FIG. 4, the cell select switch 12 is in an OFF state, the cell reset switch 13 is in an OFF state, the integration capacitor connect switch 23 is in an ON state, and the integrator reset switch 24 is in an ON state. Note that the constant current source connect switch 41 may be in an ON state, or in an OFF state. For example, the constant current source connect switch 41 may be in an OFF state. Thereby, the signal charge in the capacitor 22 may be discharged.

Figure 5:
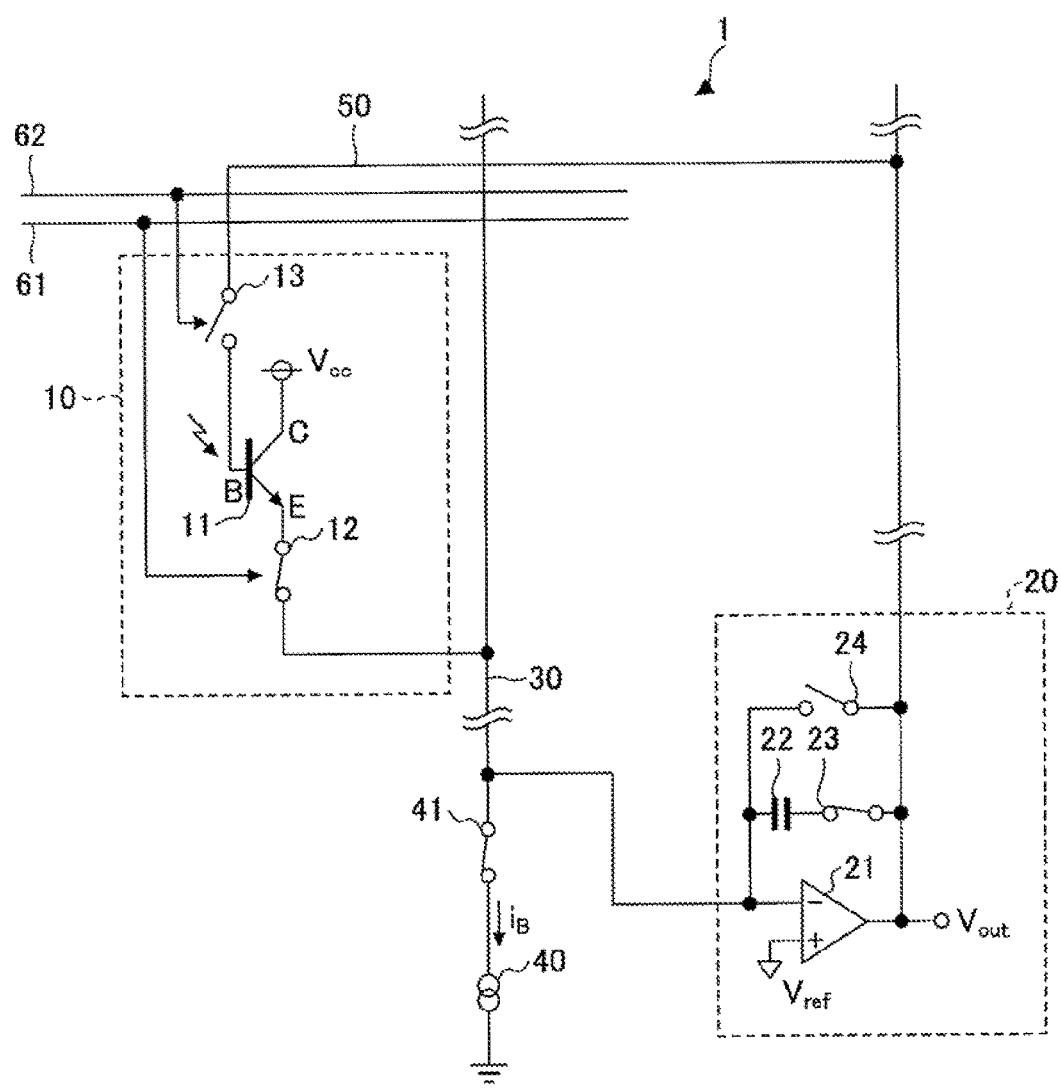
FIG. 5 is a diagram illustrating a state of the photoelectric conversion device according to the first embodiment when performing a cell select process.

Subsequently, the photoelectric conversion device 1 performs a cell select process to discharge the signal charge accumulated in the phototransistor 11. Specifically, the cell select switch 12 is turned ON and the integrator reset switch 24 is turned OFF (step S13). When the constant current source connect switch 41 is in an OFF state, the constant current source connect switch 41 is turned ON. At this time, in the photoelectric conversion device 1, as illustrated in FIG. 5, the cell select switch 12 is in an ON state, the cell reset switch 13 is in an OFF state, the integration capacitor connect switch 23 is in an ON state, the integrator reset switch 24 is in an OFF state, and the constant current source connect switch 41 is in an ON state. Thereby, the photocurrent according to the signal charge accumulated in the phototransistor 11 flows into the integrator 20. In the integrator 20, the photocurrent generated in the reading time is accumulated, the photocurrent is converted into the voltage, and the voltage is output. Note that after an end of the cell select process, the constant current source connect switch 41 is turned OFF, and reading of the output of the integrator 20 is performed. After the reading of the output of the integrator 20 is performed, the constant current source connect switch 41 is turned ON again. The signal output from the integrator 20 is converted into a digital signal by an AD converter (which will be described later), and the photoelectric conversion device 1 outputs the digital signal. Note that the constant current source 40 is connected to the output line 30, and the photocurrent flows into the integrator 20 after a constant current $i_B$ set up by the constant current source 40 is reduced from the photocurrent output from the phototransistor 11.

Figure 6:
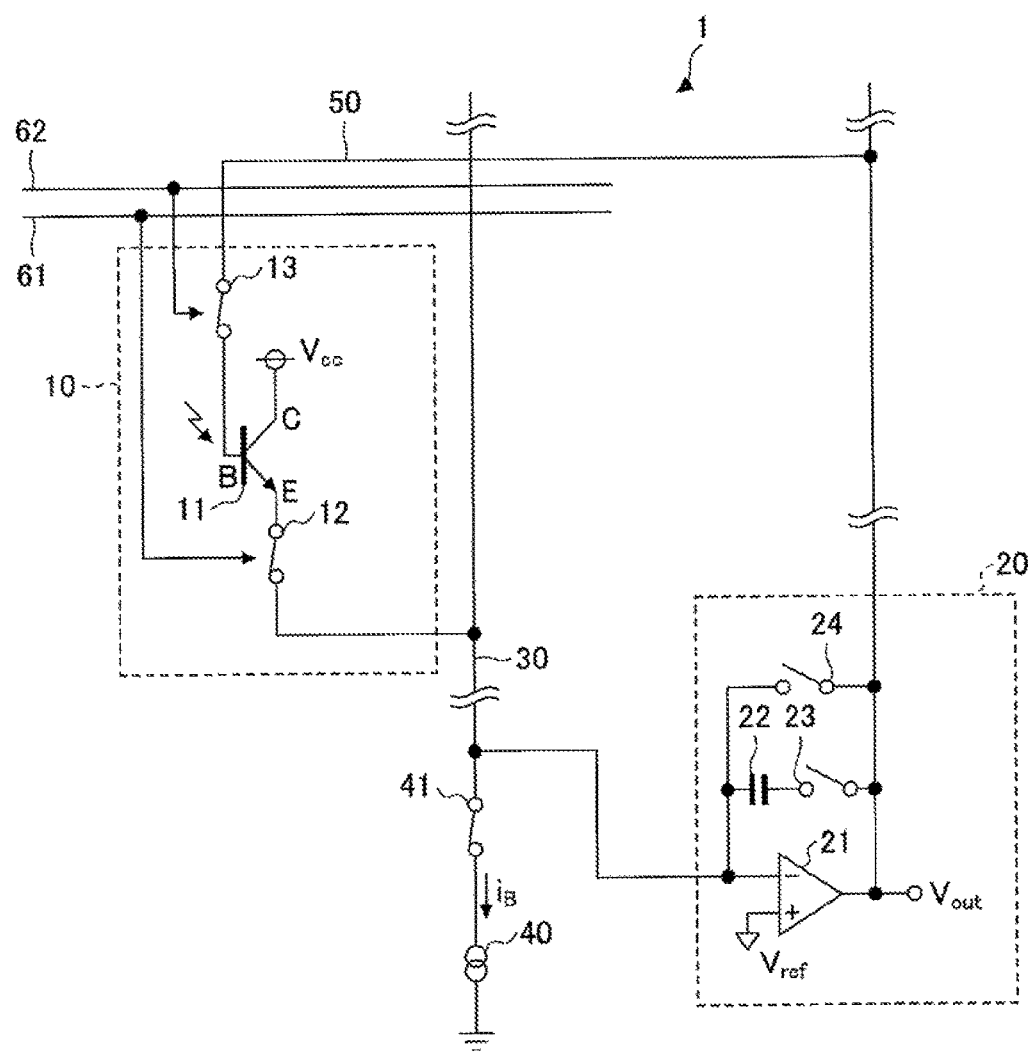
FIG. 6 is a diagram illustrating a state of the photoelectric conversion device according to the first embodiment when performing a cell reset process.

Subsequently, the photoelectric conversion device 1 performs a cell reset process to discharge the signal charge accumulated in the phototransistor 11. Specifically, the cell reset switch 13 is turned ON and the integration capacitor connect switch 23 is turned OFF (step S14). At this time, in the photoelectric conversion device 1, as illustrated in FIG. 6, the cell select switch 12 is in an ON state, the cell reset switch 13 is in an ON state, the integration capacitor connect switch 23 is in an OFF state, and the integrator reset switch 24 is in an OFF state. Thereby, a feedback loop is formed by the base region B and the emitter region E of the phototransistor 11, the cell select switch 12, the output line 30, the operational amplifier 21 of the integrator 20, the reset line 50, and the cell reset switch 13. An electric potential of the output line 30 is controlled to be equal to a reference voltage $V_{ref}$, and the base-to-emitter voltage $V_{BE}$ of the phototransistor 11 is controlled to be equal to a value that allows the passage of the current $i_B$ set up by the constant current source 40 even if the phototransistor 11 has different characteristics.

Subsequently, after the process of step S14 is completed, the operation of the photoelectric conversion device 1 is returned to step S11 again, and the above-described processes of steps S11 to S14 are repeated.

Figure 7:
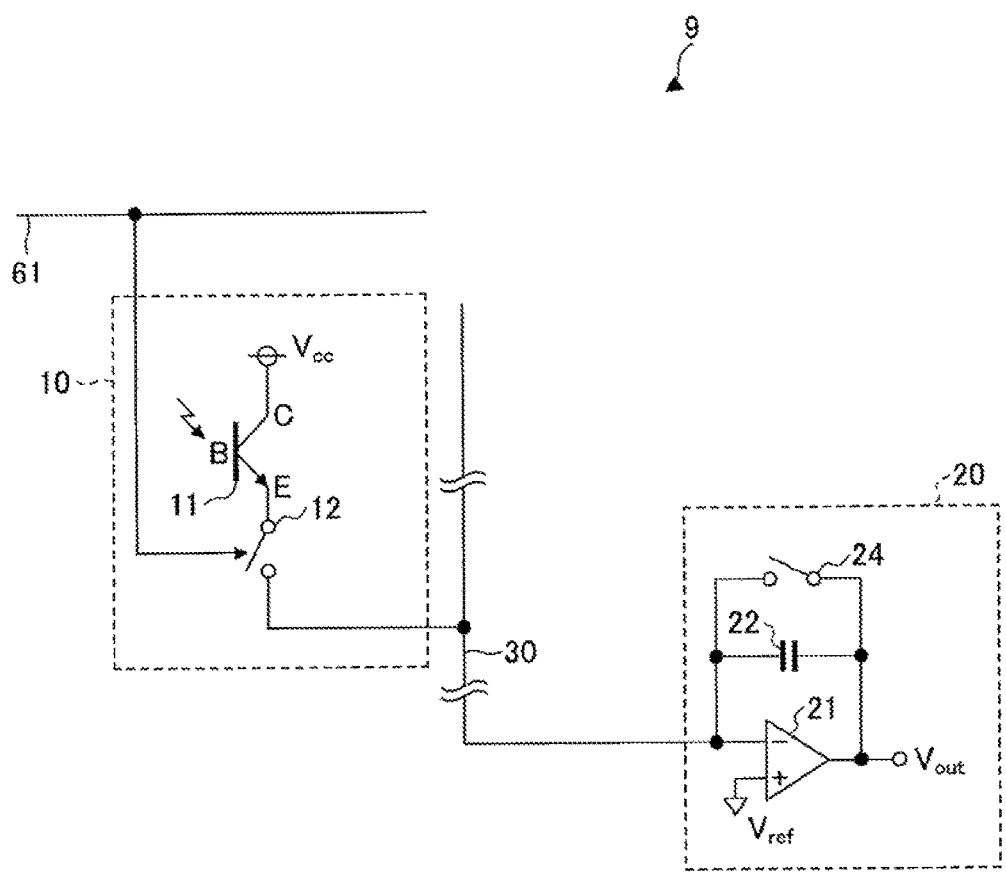
FIG. 7 is an equivalent circuit diagram illustrating a photoelectric conversion device according to the related art.

Next, a photoelectric conversion device of a comparative example in which a base region of a phototransistor is set in a floating state will be described for the purpose of comparison with the photoelectric conversion device 1 according to the first embodiment. FIG. 7 is an equivalent circuit diagram illustrating a photoelectric conversion device 9 according to the related art.

As illustrated in FIG. 7, the photoelectric conversion device 9 includes a pixel cell 10, an integrator 20 disposed for the pixel cell 10, and an output line 30 as a path for reading signal charge. The pixel cell 10, the integrator 20, and the output line 30 of this photoelectric conversion device 9 are essentially the same as corresponding elements of the photoelectric conversion device 1 according to the first embodiment, and a description thereof will be omitted. In the photoelectric conversion device 9 of the comparative example, the cell select process is set to the cell select process and the cell reset process in combination.

Operation of the photoelectric conversion device 9 of the comparative example will be described.

The base region B of the phototransistor 11 is set in a floating state immediately after the accumulation process is initiated, a collector-to-base voltage $V_{CB}$ is fixed due to the parasitic capacitance. The optical energy is received at the phototransistor 11 in this condition, the signal charge according to the optical energy is accumulated in the phototransistor 11, and the collector-to-base voltage $V_{CB}$ is reduced. At this time, the base potential increases as the optical energy increases. In the meantime, the emitter potential is in a floating state, and the signal charge accumulated in the parasitic capacitance between the base and the emitter is maintained so that the base-to-emitter voltage $V_{BE}$ indicates a constant value.

When the cell select switch 12 is turned ON, the pixel cell 10 is selected. When the emitter potential is fixed to the reference voltage $V_{ref}$, the signal charge accumulated in the base region B is converted into a base current, and the current flows toward the emitter. At this time, by the bipolar transistor amplification action, the current flows from the collector region C to the emitter region E, and such current combined with the base current results in the photocurrent.

Immediately after the pixel cell 10 is selected, the base current increases steeply and the base potential decreases greatly. However, with the passage of time, the decrease amount of the base potential is reduced gradually, and the base potential will reach a fixed value. In this manner, the decrease amount of the base potential is reduced with the passage of time, and there may be a case in which the reading time of the signal charge elapses before the base potential reaches the fixed value. In such a case, the base potential before reaching the fixed value remains as the potential when the phototransistor 11 is reset, and the following accumulation process is performed. Hence, the amount of the signal charge accumulated by that accumulation process is affected by the state of the phototransistor before that accumulation process is initiated, and the amount of the signal charge may deviate from an accurate amount of the signal charge generated according to the optical energy (a reset error). Note that the base potential when the phototransistor 11 is reset varies depending on the amount of optical energy received by the phototransistor 11.

Figure 8:
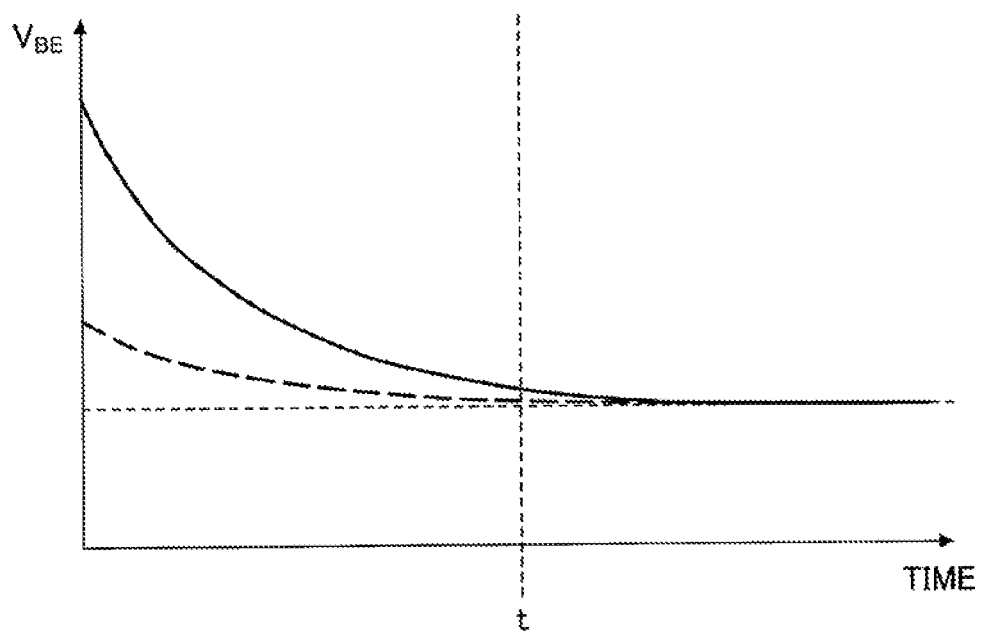
FIG. 8 is a diagram for explaining changes of a base-to-emitter voltage when resetting a phototransistor.

Specifically, as illustrated in FIG. 8, the base-to-emitter voltage $V_{BE}$ at a reading end time ("t" indicated in FIG. 8) increases as the amount of optical energy received by the phototransistor 11 increases. FIG. 8 illustrates changes of the base-to-emitter voltage $V_{BE}$ of the phototransistor 11 when the phototransistor 11 is reset. In FIG. 8, the horizontal axis indicates the elapsed time, and the vertical axis indicates the base-to-emitter voltage $V_{BE}$. Further, in FIG. 8, the solid line expresses a case in which a large amount of optical energy is received by the phototransistor 11, and the long dashed line expresses a case in which a small amount of optical energy is received by the phototransistor 11.

In the photoelectric conversion device 1 according to this embodiment, however, the reset process is performed to establish the base-to-emitter voltage $V_{BE}$ of the phototransistor 11 that allows the passage of the constant current in which is set up by the constant current source 40.

Hence, in the photoelectric conversion device 1 according to this embodiment, the base potential is quickly set earlier than a time for the base potential to reach the potential of the base region B in a floating state which is completely reset when the potential of the emitter region E is fixed. Consequently, reset errors may be reduced even if the amount of optical energy received by the phototransistor 11 varies and the amount of the signal charge accumulated in the phototransistor 11 varies.

In the photoelectric conversion device 1 according to this embodiment, it is possible to set up bias conditions between the base and the emitter of the phototransistor 11. Hence, by setting up the bias conditions beforehand to perform the reset process at high speed, the time (reset time) needed to reset the electric charge accumulated in the phototransistor may be reduced and the reading time may be reduced.

When the photoelectric conversion device 1 includes a plurality of pixel cells 10, the phototransistor 11 is disposed in each of the pixel cells 10. However, such phototransistors 11 may have variations in their characteristics. When the phototransistors 11 have variations in their characteristics, the following problem may take place. Each of the phototransistors 11 is reset by fixing the base potential to the reset potential. In such a case, if the reset potential is fixed for all the pixel cells 10, the output current when the base-to-emitter voltage $V_{BE}$ determined according to the reset condition is supplied may have variations due to the variations in the characteristics of the phototransistors 11.

However, in the photoelectric conversion device 1 according to this embodiment, even when the phototransistors 11 have variations in their characteristics, the reset process is performed so that the identical emitter current is output from each of the phototransistors 11. Consequently, the variations in the characteristics of the phototransistors 11 may be prevented.

Figure 9A:
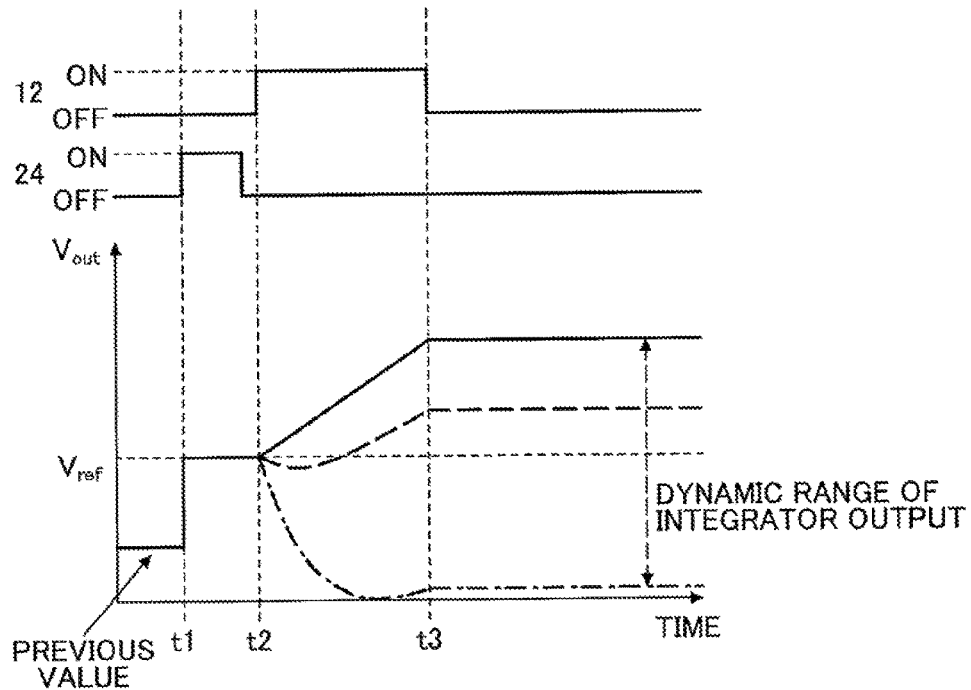
FIG. 9A and FIG. 9B are graphs illustrating a relationship between an output voltage of an integrator and the elapsed time.
Figure 9B:
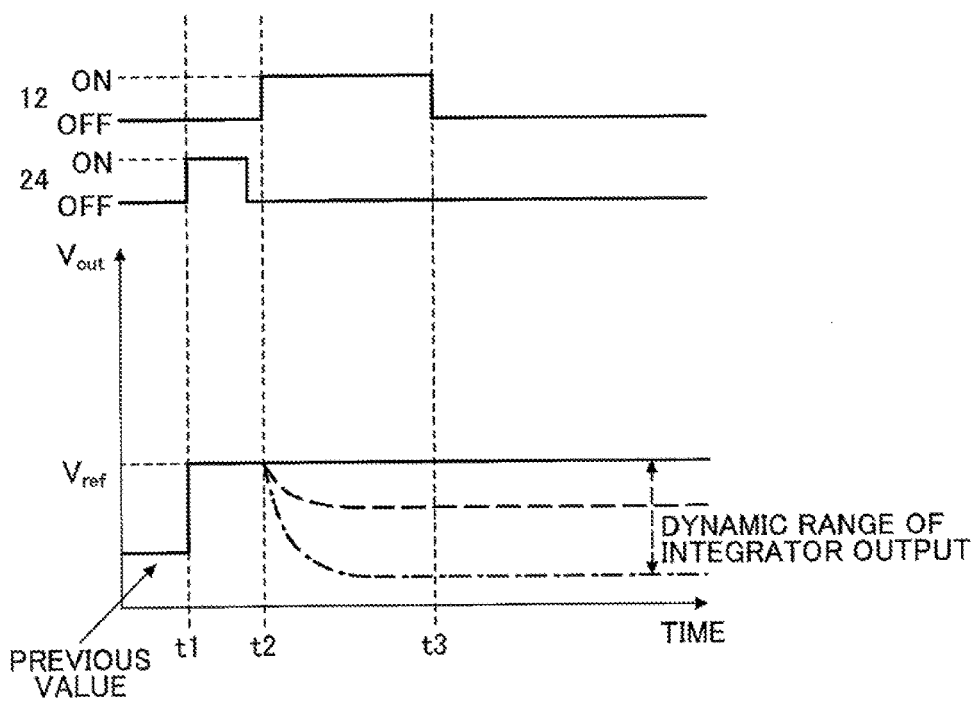

Next, a relationship between the output voltage of the integrator 20 and the elapsed time will be described. FIGS. 9A and 9B illustrate a relationship between the output voltage of the integrator and the elapsed time.

Specifically, FIG. 9A illustrates a relationship between the output voltage of the integrator 20 in the photoelectric conversion device 1 of the first embodiment and the elapsed time. FIG. 9B illustrates a relationship between the output voltage of the integrator 20 in the photoelectric conversion device 9 of the comparative example and the elapsed time. The vertical axis indicates the output voltage $V_{out}$ of the integrator 20, and the horizontal axis indicates the elapsed time.

In the upper portion of each of FIGS. 9A and 9B, operating states of the cell select switch 12 and the integrator reset switch 24 are illustrated. In the lower portion of each of FIGS. 9A and 9B, the relationship between the output voltage of the integrator 20 and the elapsed time.

As illustrated in FIG. 9A, in the case of the photoelectric conversion device 1 of the first embodiment, when the integrator reset switch 24 is turned ON (time t1), the integrator reset process is performed and the output voltage $V_{out}$ is set to the reference voltage $V_{ref}$.

Subsequently, after the integrator reset switch 24 is turned OFF, the cell select switch 12 is turned ON (time t2). At this time, the cell select process is performed and the output voltage $V_{out}$ changes according to the amount of the signal charge accumulated in the phototransistor 11. Specifically, when no signal charge is accumulated in the phototransistor 11 (a dark condition), the current flows from the integrator 20 to the constant current source 40, and the output voltage $V_{out}$ increases with the passage of time as indicated by the solid line in FIG. 9A. When a small amount of the signal charge is accumulated in the phototransistor 11, the photocurrent flows from the pixel cell 10 to the integrator 20 initially, and the output voltage $V_{out}$ decreases initially. However, with the passage of time, the current flows from the integrator 20 to the constant current source 40, and the output voltage $V_{out}$ increases gradually as indicated by the long dashed line in FIG. 9A. Further, when a large amount of the signal charge is accumulated in the phototransistor 11, the photocurrent flows from the pixel cell 10 to the integrator 20, and the output voltage $V_{out}$ decreases with the passage of time as indicated by the one-dotted chain line in FIG. 9A.

Subsequently, the cell select switch 12 is turned OFF and the cell select process is terminated (time t3). At this time, the output voltage $V_{out}$ of the integrator 20 is maintained at a constant value.

In this manner, in the case of the photoelectric conversion device 1 according to the first embodiment, when no signal charge is accumulated in the phototransistor 11 (the dark condition), the current flows from the integrator 20 to the constant current source 40, and the output voltage $V_{out}$ increases with the passage of time. The output voltage $V_{out}$ at this time is higher than the reference voltage $V_{ref}$ by a voltage level represented by (the current of the constant current source 40)×(the reading time)/(the capacity of the capacitor 22). Accordingly, the dynamic range becomes wide and the S/N ratio becomes great.

On the other hand, in the case of the photoelectric conversion device 9 of the comparative example, the photocurrent of the pixel cell 10 flows into the integrator 20 regardless of the amount of the signal charge accumulated in the phototransistor 11, and the output voltage $V_{out}$ of the integrator 20 is always lower than the reference voltage $V_{ref}$. Accordingly, the dynamic range becomes narrow and it is difficult to obtain a great S/N ratio.

Specifically, as illustrated in FIG. 9B, in the case of the photoelectric conversion device 9 of the comparative example, when the integrator reset switch 24 is turned ON (time t1), the integrator reset process is performed, and the output voltage $V_{out}$ is set to the reference voltage $V_{ref}$.

Subsequently, after the integrator reset switch 24 is turned OFF, the cell select switch 12 is turned ON (time t2). At this time, the cell select process is performed. The output voltage $V_{out}$ changes according to the amount of the signal charge accumulated in the phototransistor 11. Specifically, when no signal charge is accumulated in the phototransistor 11 (a dark condition), the current does not flow from the phototransistor 11 to the integrator 20 and the output voltage $V_{out}$ remains unchanged as indicated by the solid line in FIG. 9B. When a small amount of the signal charge is accumulated in the phototransistor 11, the current flows from the phototransistor 11 to the integrator 20, and the output voltage $V_{out}$ decreases as indicated by the long dashed line FIG. 9B. Further, when a large amount of the signal charge is accumulated in the phototransistor 11, the amount of the current flowing to the integrator 20 from the phototransistor 11 in this case is larger than that in the case in which the small amount of the signal charge is accumulated in the phototransistor 11, and the output voltage $V_{out}$ decreases further as indicated by the one-dotted chain line in FIG. 9B.

Subsequently, the cell select switch 12 is turned OFF (time t3) and the cell select process is terminated. The output voltage $V_{out}$ of the integrator 20 is maintained at a constant value.

Second Embodiment

Figure 10:
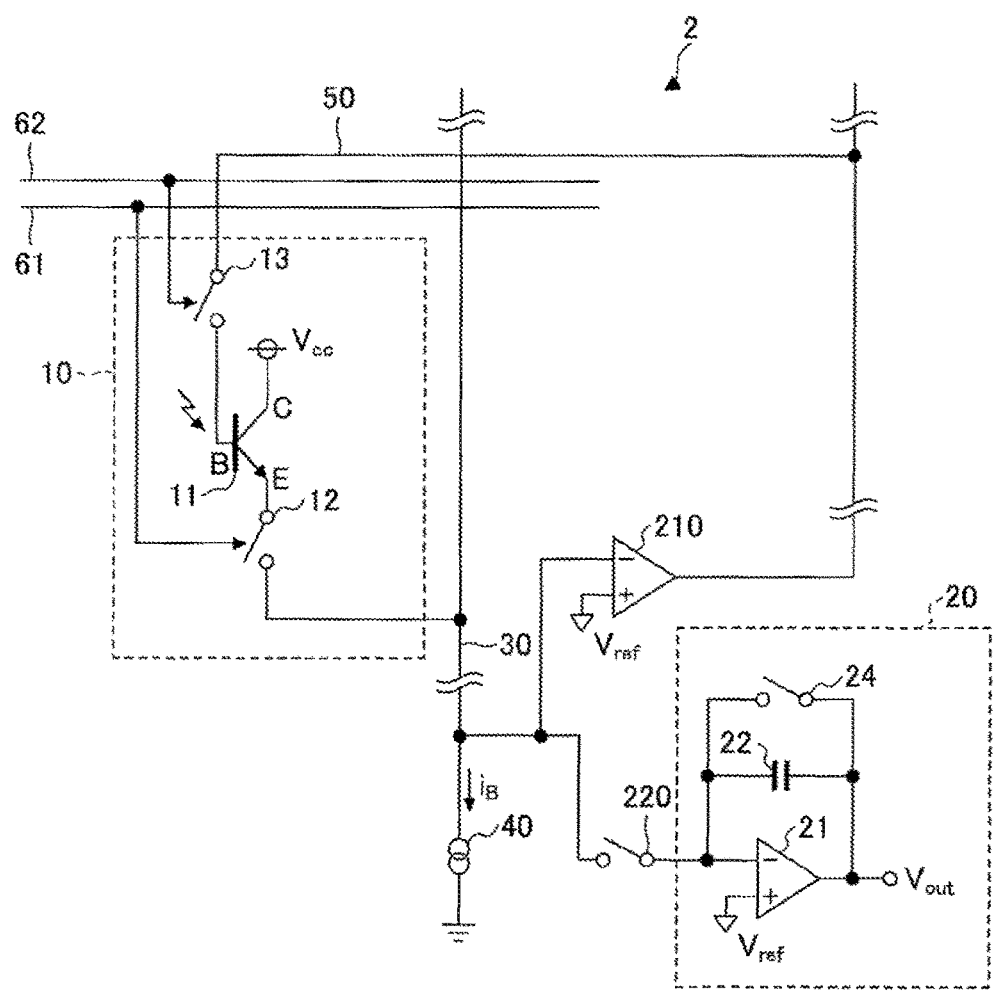
FIG. 10 is an equivalent circuit diagram illustrating a photoelectric conversion device according to a second embodiment.

A configuration of a photoelectric conversion device 2 according to a second embodiment will be described. FIG. 10 is an equivalent circuit diagram illustrating the photoelectric conversion device 2 according to the second embodiment.

As illustrated in FIG. 10, the photoelectric conversion device 2 according to the second embodiment is essentially the same as the photoelectric conversion device 1 according to the first embodiment, except that the photoelectric conversion device 2 further includes an operational amplifier (feedback amplifier) 210 configured to perform the cell reset process and disposed to be separate from the operational amplifier 21 of the integrator 20, and an integrator connect switch 220 configured to be switched between an ON state to connect the output line 30 to the integrator 20 and an OFF state to disconnect the output line 30 from the integrator 20. Other elements of the photoelectric conversion device 2 of the second embodiment are essentially the same as corresponding elements of the photoelectric conversion device 1 of the first embodiment, and a description thereof will be omitted.

As illustrated in FIG. 10, the photoelectric conversion device 2 includes the pixel cell 10, the integrator 20, the output line 30, the constant current source 40, the reset line 50, the feedback amplifier 210, and the integrator connect switch 220.

The pixel cell 10 is an example of the photoelectric conversion unit, and the above-described configuration including the output line 30, the constant current source 40, the reset line 50, the feedback amplifier 210, and the integrator connect switch 220 is an example of the base potential setting unit.

The feedback amplifier 210 is disposed to branch OFF from the path of the output line 30, and an output of the feedback amplifier 210 is connected to the base region B of the phototransistor 11 via the cell reset switch 13.

The integrator connect switch 220 may be a switch disposed on the output line 30 to connect the pixel cell 10 to the integrator 20 or to disconnect the pixel cell 10 from the integrator 20. The pixel cell 10 is connected to the integrator connect switch 220, and when the integrator connect switch 220 is turned ON, the pixel cell 10 is connected to the integrator 20 via the integrator connect switch 220.

Figure 11:
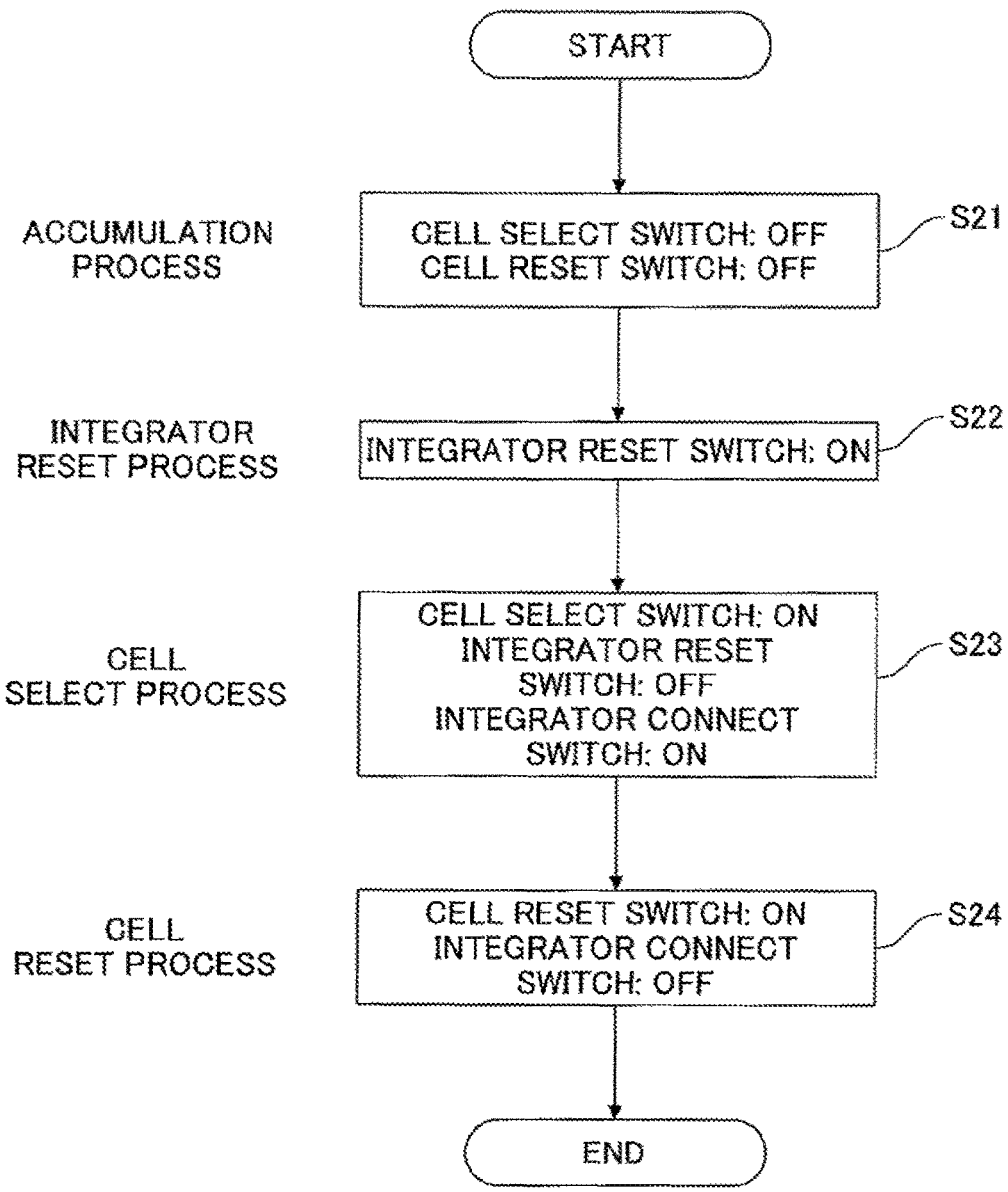
FIG. 11 is a flowchart for explaining operation of the photoelectric conversion device according to the second embodiment.

Next, an example of operation of the photoelectric conversion device 2 according to the second embodiment will be described. FIG. 11 is a flowchart for explaining operation of the photoelectric conversion device according to the second embodiment.

Upon reception of instructions from a control unit (not illustrated) via the control lines 61 and 62, the photoelectric conversion device 2 performs various processes of steps S21 to S24 as illustrated in FIG. 11. FIGS. 12 to 15 are diagrams illustrating various states of the photoelectric conversion device 2 according to the second embodiment when performing the various processes.

Figure 12:
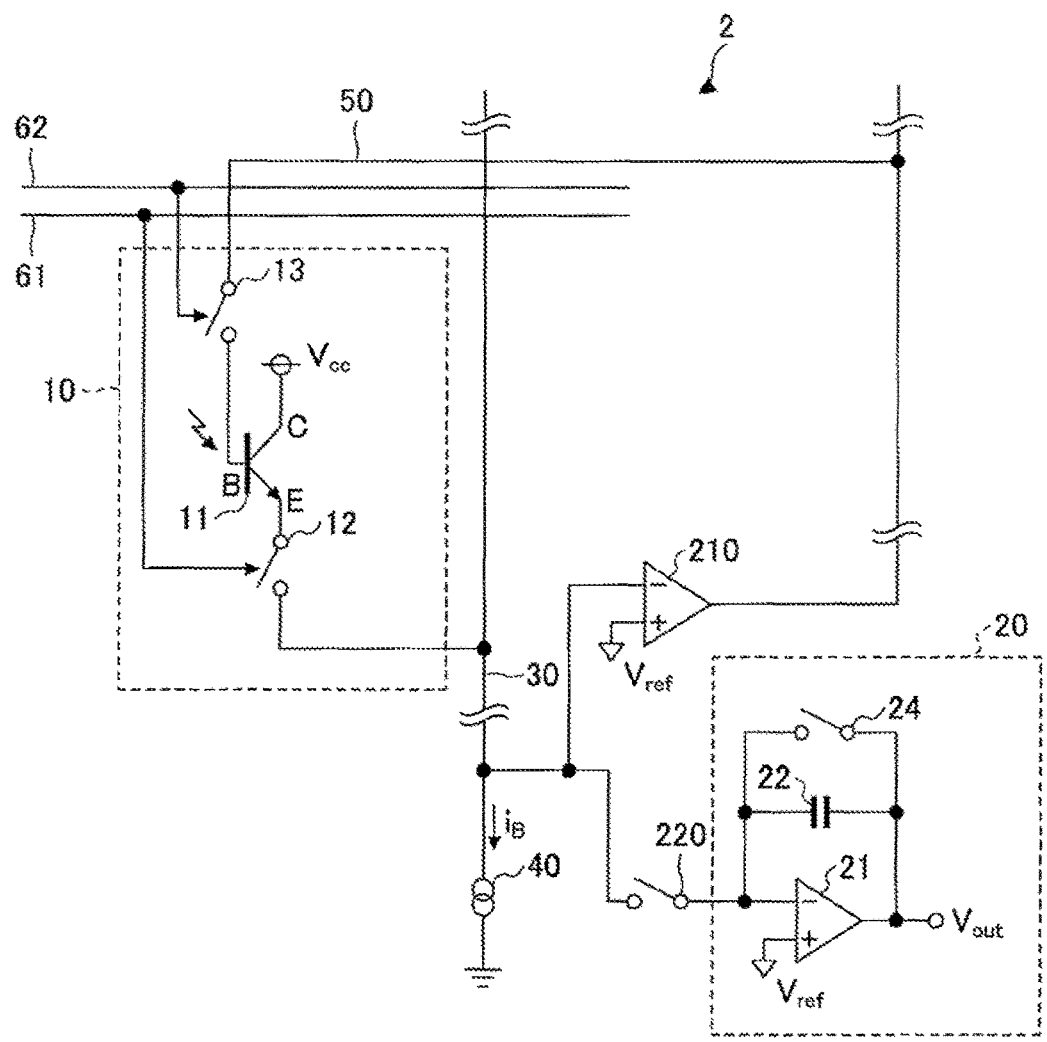
FIG. 12 is a diagram illustrating a state of the photoelectric conversion device according to the second embodiment when performing the accumulation process.

First, the photoelectric conversion device 2 performs an accumulation process to accumulate signal charge in the phototransistor 11. Specifically, the cell select switch 12 is turned OFF and the cell reset switch 13 is turned OFF (step S21). At this time, in the photoelectric conversion device 2, as illustrated in FIG. 12, the cell select switch 12 is in an OFF state and the cell reset switch 13 is in an OFF state. Note that the integrator reset switch 24 and the integrator connect switch 220 may be in an ON state or in an OFF state. In the phototransistor 11, upon reception of an incident optical energy, the optical energy is converted into signal charge. In this condition, the emitter region E and the base region B of the phototransistor 11 in the pixel cell 10 are in a floating state. Hence, the signal charge generated according to the optical energy is accumulated in the base region B starting from the base potential set up by the cell reset process (which will be described later), and the base-to-collector voltage $V_{BC}$ of the phototransistor 11 is reduced.

Figure 13:
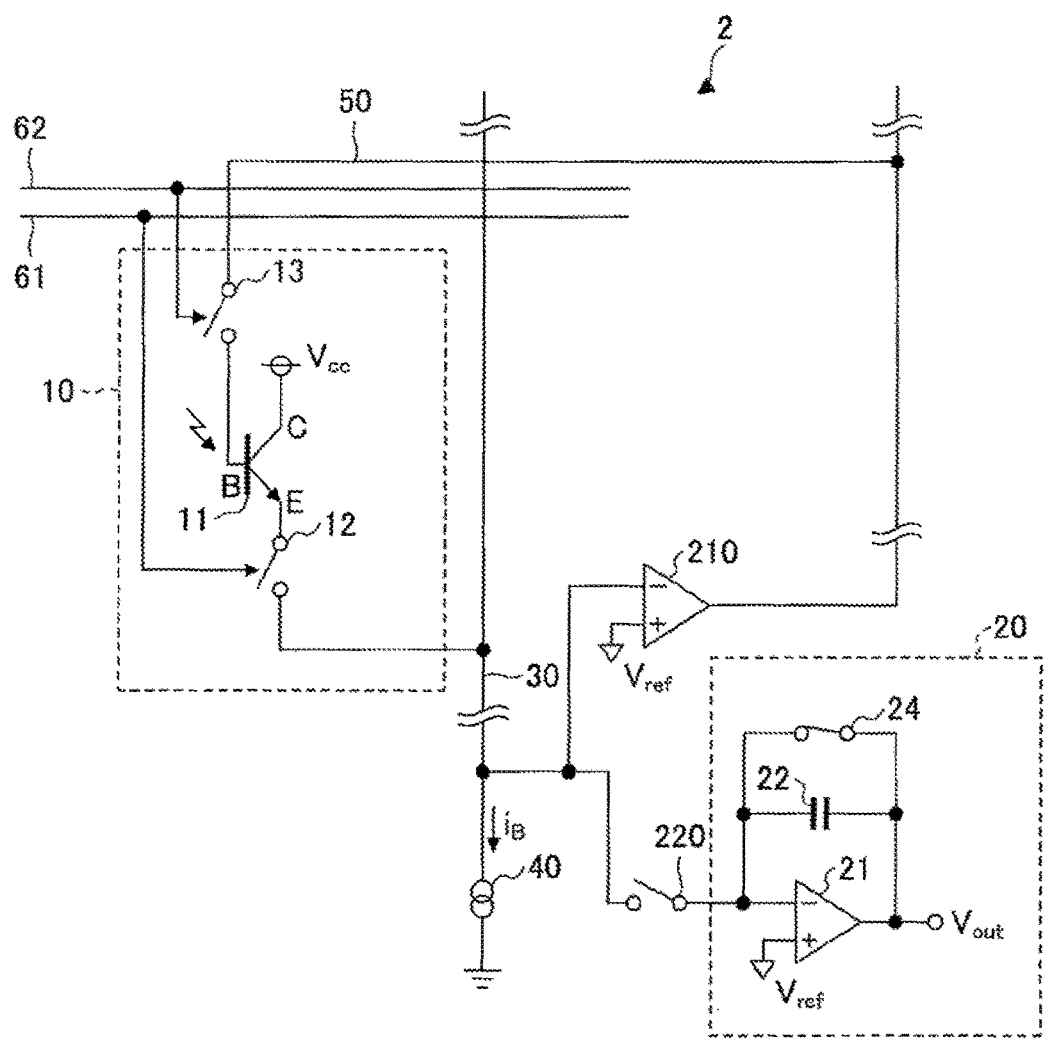
FIG. 13 is a diagram illustrating a state of the photoelectric conversion device according to the second embodiment when performing the integrator reset process.

Subsequently, the photoelectric conversion device 2 performs an integrator reset process to discharge the signal charge in the capacitor 22 of the integrator 20. Specifically, the integrator reset switch 24 is turned ON (step S22). At this time, in the photoelectric conversion device 2, as illustrated in FIG. 13, the cell select switch 12 is in an OFF state, the cell reset switch 13 is in an OFF state, and the integrator reset switch 24 is in an ON state. Note that the integrator connect switch 220 at this time may be in an ON state or in an OFF state. It is preferable that the integrator connect switch 220 is in an OFF state, in order to reduce the error due to the ON resistance when the current flows through the integrator connect switch 220. By performing the integrator reset process, the signal charge in the capacitor 22 may be discharged.

Figure 14:
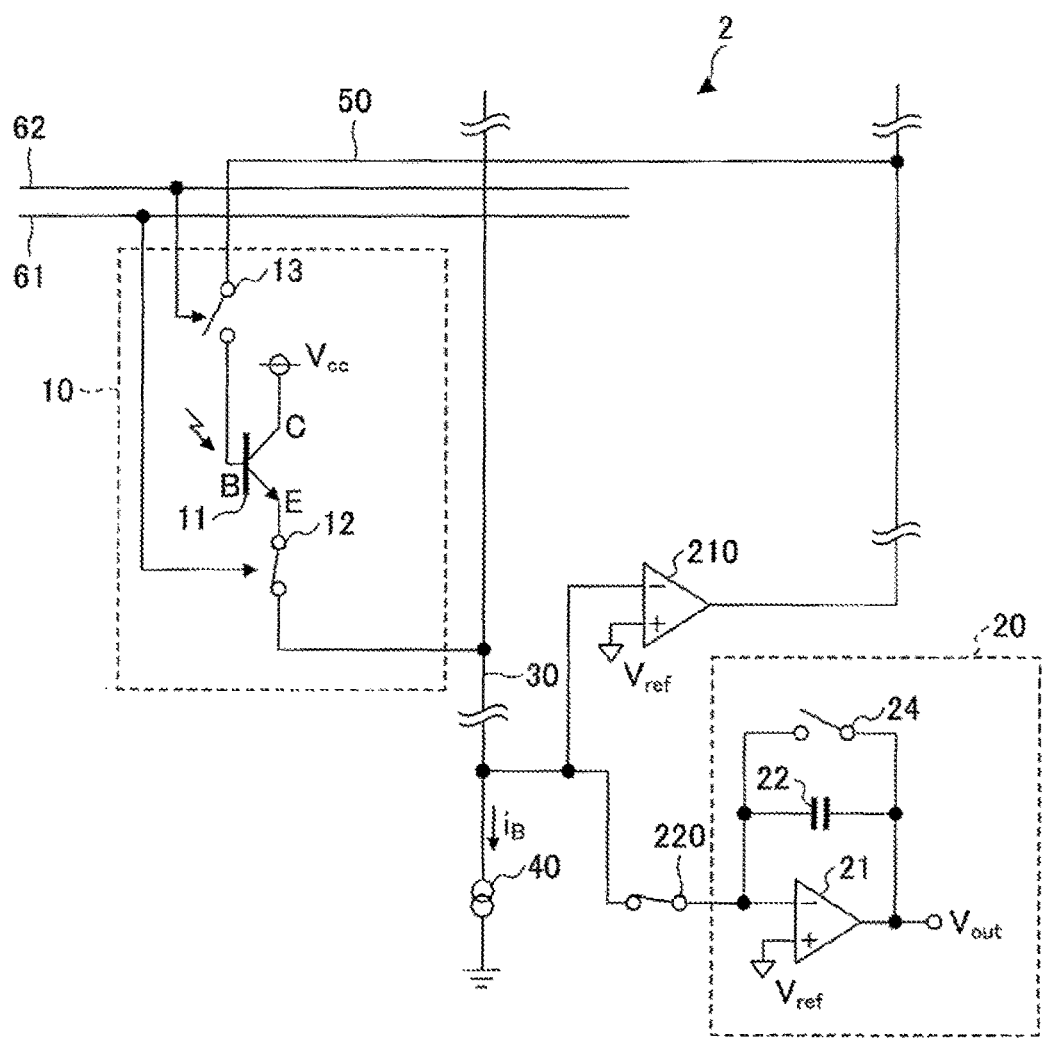
FIG. 14 is a diagram illustrating a state of the photoelectric conversion device according to the second embodiment when performing the cell select process.

Subsequently, the photoelectric conversion device 2 performs a cell select process to discharge the signal charge accumulated in the phototransistor 11. Specifically, the cell select switch 12 is turned ON, the integrator reset switch 24 is turned OFF, and the integrator connect switch 220 is turned ON (step S23). At this time, in the photoelectric conversion device 2, as illustrated in FIG. 14, the cell select switch 12 is in an ON state, the cell reset switch 13 is in an OFF state, the integrator reset switch 24 is in an OFF state, and the integrator connect switch 220 is in an ON state. Hence, the photocurrent according to the signal charge accumulated in the phototransistor 11 flows into the integrator 20. In the integrator 20, the photocurrent generated in the reading time is accumulated and the photocurrent is converted into a voltage, so that the integrator 20 outputs the voltage. Note that, after the cell select process is terminated, the constant current source connect switch 41 is turned OFF and the output of the integrator 20 is read. After the reading of the output of the integrator 20 is performed, the constant current source connect switch 41 is turned ON again. The signal output from the integrator 20 is converted into a digital signal by an AD converter (which will be described later) and the photoelectric conversion device 2 outputs the digital signal. Note that the constant current source 40 is connected to the output line 30, and the photocurrent flows into the integrator 20 after the current $i_B$ set up by the constant current source 40 is reduced from the photocurrent output from the phototransistor 11.

Figure 15:
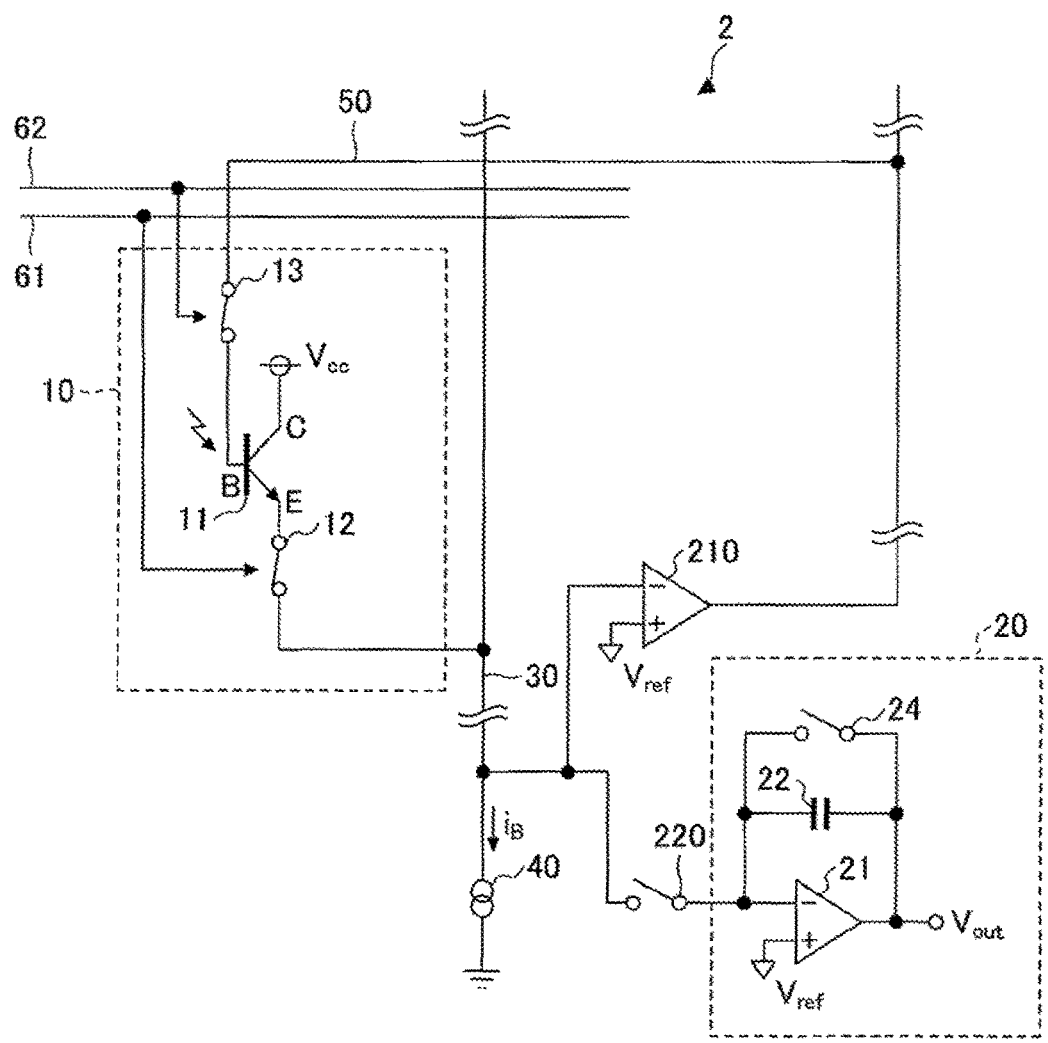
FIG. 15 is a diagram illustrating a state of the photoelectric conversion device according to the second embodiment when performing the cell reset process.

Subsequently, the photoelectric conversion device 2 performs a cell reset process to discharge the signal charge accumulated in the phototransistor 11. Specifically, the cell reset switch 13 is turned ON and the integrator connect switch 220 is turned OFF (step S24). At this time, in the photoelectric conversion device 2, as illustrated in FIG. 15, the cell select switch 12 is in an ON state, the cell reset switch 13 is in an ON state, the integrator reset switch 24 is in an OFF state, and the integrator connect switch 220 is in an OFF state. Thereby, a feedback loop is formed by the base region B and the emitter region E of the phototransistor 11, the cell select switch 12, the output line 30, the feedback amplifier 210, the reset line 50, and the cell reset switch 13. An electric potential of the output line 30 is controlled to be equal to the reference voltage $V_{ref}$, and the base-to-emitter voltage $V_{BE}$ of the phototransistor 11 is controlled to be equal to a value that allows the passage of the current $i_B$ set up by the constant current source 40 even if the phototransistor 11 has different characteristics.

Subsequently, after the process of step S24 is completed, the operation of the photoelectric conversion device 2 is returned to step S21 again, and the above-described processes of steps S21 to S24 are repeated.

According to the above-described photoelectric conversion device 2 of the second embodiment, in addition to the advantageous effects of the first embodiment, the following advantageous effect is obtained. Namely, the photoelectric conversion device 2 of the second embodiment includes the feedback amplifier 210 for use when performing the cell reset process and the feedback amplifier 210 is separate from the operational amplifier 21 of the integrator 20. Hence, it is possible for the second embodiment to provide a flexible design for the photoelectric conversion device 2. There may be a case in which it is demanded that the operational amplifier 210 and the operational amplifier 21 have mutually different characteristics. In such a case, according to the photoelectric conversion device 2 of the second embodiment, the optimal operational amplifiers may be selected for both the required characteristics.

In the second embodiment, a case in which the integrator reset switch 24 is in an OFF state during the cell reset process has been described. However, it is to be understood that the second embodiment described above is exemplary and explanatory and is not restrictive of the invention as claimed. For example, the integrator reset switch 24 may be in an ON state during the cell reset process.

Third Embodiment

Figure 16:
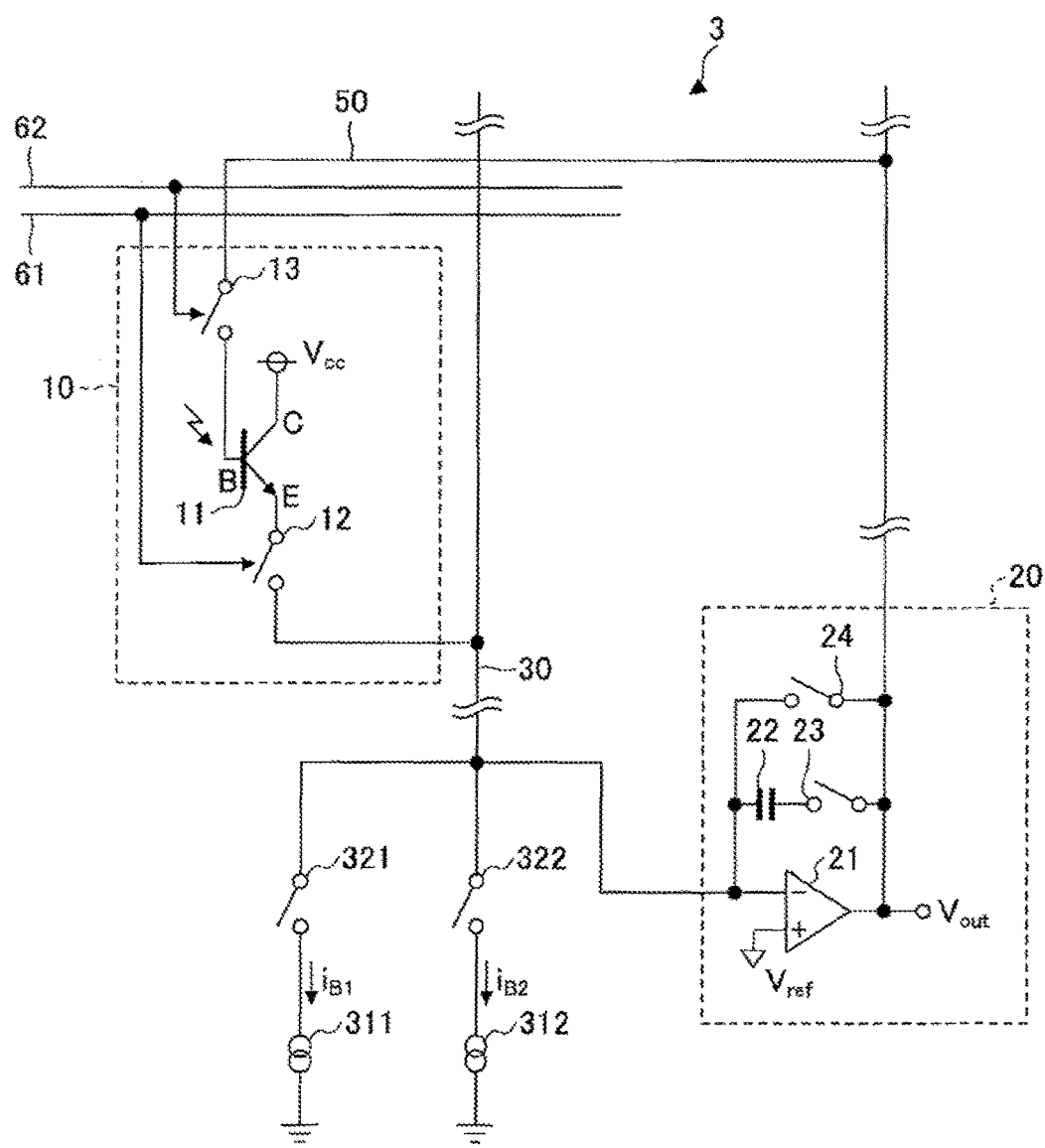
FIG. 16 is an equivalent circuit diagram illustrating a photoelectric conversion device according to a third embodiment.

A configuration of a photoelectric conversion device 3 according to a third embodiment will be described. FIG. 16 is an equivalent circuit diagram illustrating the photoelectric conversion device 3 according to the third embodiment.

As illustrated in FIG. 16, the photoelectric conversion device 3 according to the third embodiment is essentially the same as the photoelectric conversion device 1 according to the first embodiment, except that the photoelectric conversion device 3 includes two constant current sources (a first constant current source 311 and a second constant current source 312). Other elements of the photoelectric conversion device 3 of the third embodiment are essentially the same as corresponding elements of the photoelectric conversion device 1 of the first embodiment, and a description thereof will be omitted.

As illustrated in FIG. 16, the photoelectric conversion device 3 includes the pixel cell 10, the integrator 20, the output line 30, the reset line 50, the first constant current source 311, the second constant current source 312, a first constant current source connect switch 321, and a second constant current source connect switch 322.

The pixel cell 10 is an example of the photoelectric conversion unit, and the above-described configuration including the integrator 20, the output line 30, the reset line 50, the second constant current source 312, and the second constant current source connect switch 322 is an example of the base potential setting unit. Further, the above-described configuration including the first constant current source connect switch 321 and the second constant current source connect switch 322 is an example of a switch unit.

The first constant current source 311 may be a constant current source disposed to branch off from the path of the output line 30 and connected to the output line 30 via the first constant current source connect switch 321. This first constant current source 311 is used to perform the cell select process, and when the first constant current source connect switch 321 is turned ON, the first constant current source 311 is connected to the output line 30.

The second constant current source 312 may be a constant current source disposed to branch off from the path of the output line 30 and connected to the output line 30 via the second constant current source connect switch 322. This second constant current source 312 is used to perform the cell reset process, and when the second constant current source connect switch 322 is turned ON, the second constant current source 312 is connected to the output line 30.

Figure 17:
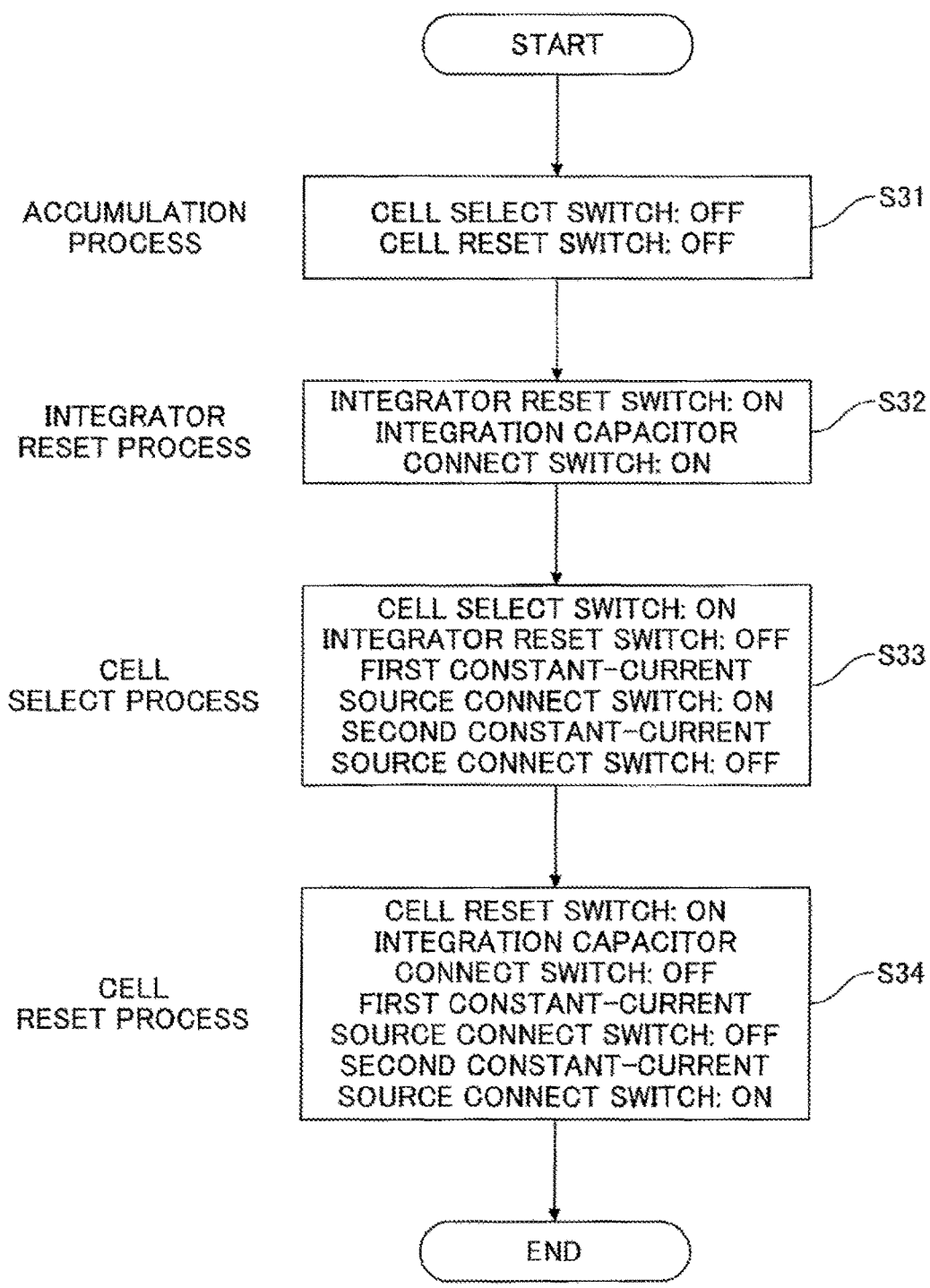
FIG. 17 is a flowchart for explaining operation of the photoelectric conversion device according to the third embodiment.

Next, an example of operation of the photoelectric conversion device 3 according to the third embodiment will be described. FIG. 17 is a flowchart for explaining operation of the photoelectric conversion device 3 according to the third embodiment.

Upon reception of instructions from a control unit (not illustrated) via the control lines 61 and 62, the photoelectric conversion device 3 performs various processes of steps S31 to S34 as illustrated in FIG. 17. FIGS. 18 to 21 are diagrams illustrating various states of the photoelectric conversion device 3 according to the third embodiment when performing the various processes.

Figure 18:
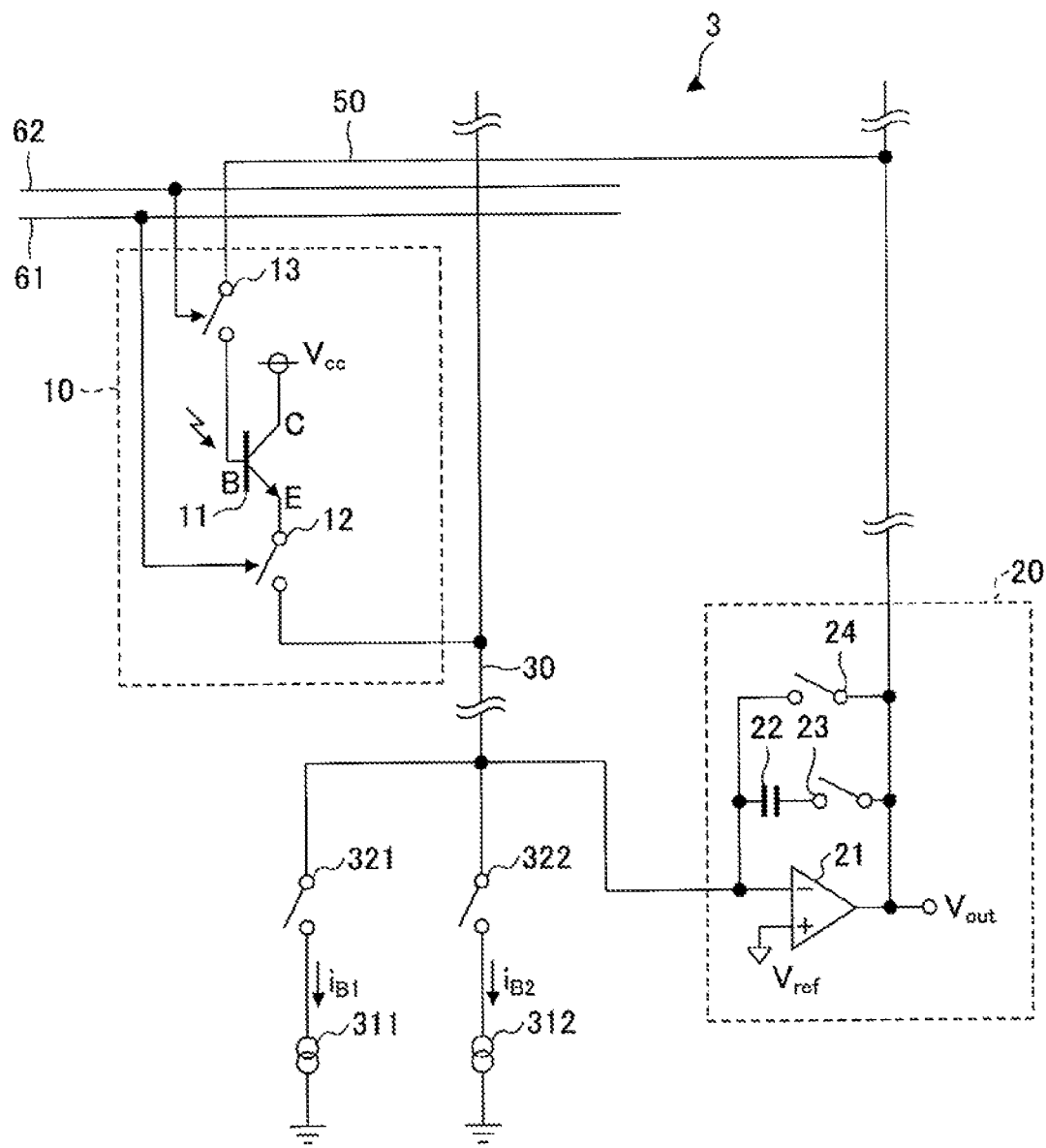
FIG. 18 is a diagram illustrating a state of the photoelectric conversion device according to the third embodiment when performing the accumulation process.

First, the photoelectric conversion device 3 performs an accumulation process to accumulate signal charge in the phototransistor 11. Specifically, the cell select switch 12 is turned OFF and the cell reset switch 13 is turned OFF (step S31). At this time, in the photoelectric conversion device 3, as illustrated in FIG. 18, the cell select switch 12 is in an OFF state, and the cell reset switch 13 is in an OFF state. Note that the integrator reset switch 24, the integration capacitor connect switch 23, the first constant current source connect switch 321, and the second constant current source connect switch 322 may be in an ON state or in an OFF state.

In the phototransistor 11, upon reception of an incident optical energy, the optical energy is converted into signal charge and the signal charge is accumulated in the base region B. In this condition, the emitter region E and the base region B of the phototransistor 11 of the pixel cell 10 are in a floating state. Hence, the signal charge generated according to the optical energy is accumulated in the base region B starting from the base potential set up by the cell reset process (which will be described later), and the base-to-collector voltage $V_{BC}$ is reduced.

Figure 19:
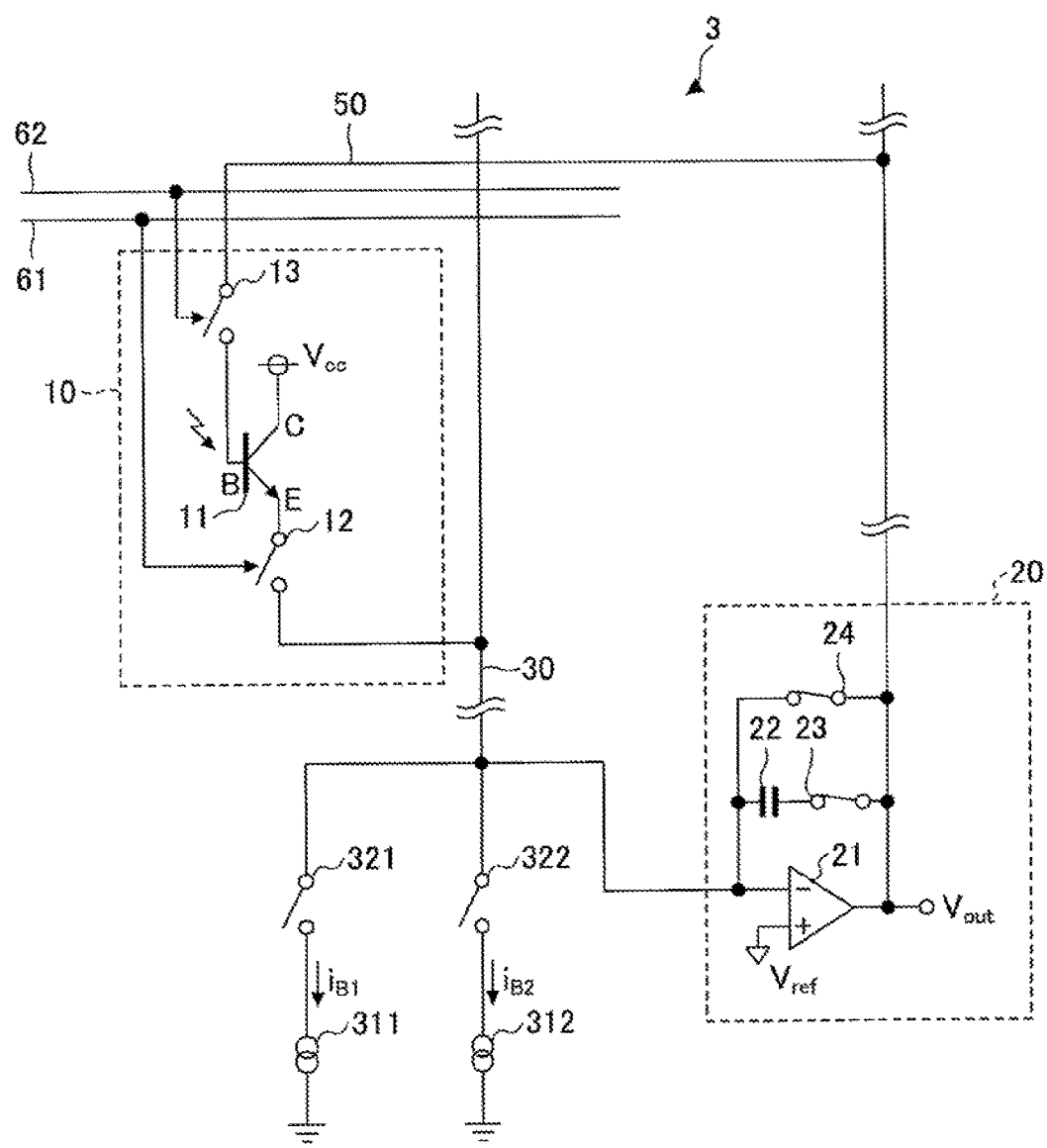
FIG. 19 is a diagram illustrating a state of the photoelectric conversion device according to the third embodiment when performing the integrator reset process.

Subsequently, the photoelectric conversion device 3 performs an integrator reset process to discharge the signal charge in the capacitor 22 of the integrator 20. Specifically, the integrator reset switch 24 is turned ON and the integration capacitor connect switch 23 is turned ON (step S32). At this time, in the photoelectric conversion device 3, as illustrated in FIG. 19, the cell select switch 12 is in an OFF state, the cell reset switch 13 is in an OFF state, the integration capacitor connect switch 23 is in an ON state, and the integrator reset switch 24 is in an ON state. Thereby, the signal charge in the capacitor 22 may be discharged. Note that the first constant current source connect switch 321 and the second constant current source connect switch 322 at this time may be in an ON state or in an OFF state. It is preferable that these switches are in an OFF state, in order to reduce the error due to the ON resistance when the current flows through the first constant current source connect switch 321 and the second constant current source connect switch 322.

Figure 20:
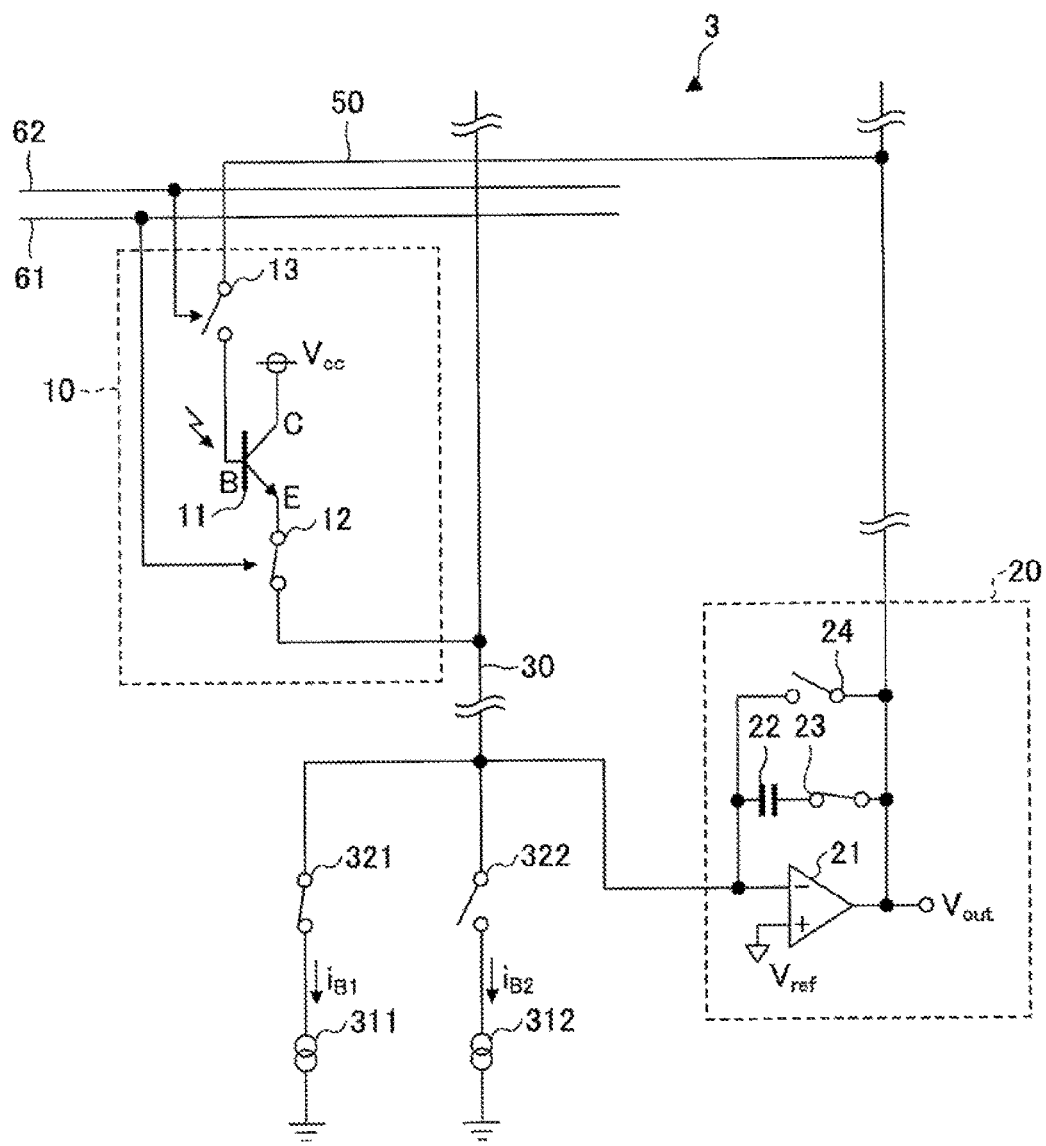
FIG. 20 is a diagram illustrating a state of the photoelectric conversion device according to the third embodiment when performing the cell select process.

Subsequently, the photoelectric conversion device 3 performs a cell select process to discharge the signal charge accumulated in the phototransistor 11. Specifically, the cell select switch 12 is turned ON, the integrator reset switch 24 is turned OFF, the first constant current source connect switch 321 is turned ON, and the second constant current source connect switch 322 is turned OFF (step S33). At this time, in the photoelectric conversion device 3, as illustrated in FIG. 20, the cell select switch 12 is in an ON state, the cell reset switch 13 is in an OFF state, the integration capacitor connect switch 23 is in an ON state, the integrator reset switch 24 is in an OFF state, the first constant current source connect switch 321 is in an ON state, and the second constant current source connect switch 322 is in an OFF state. Hence, the photocurrent according to the signal charge accumulated in the phototransistor 11 flows into the integrator 20. In the integrator 20, the photocurrent generated in the reading time is accumulated and the photocurrent is converted into a voltage, so that the integrator 20 outputs the voltage. Note that, after the cell select process is terminated, the constant current source connect switch 41 is turned OFF and the output of the integrator 20 is read. After the reading of the output of the integrator 20 is performed, the constant current source connect switch 41 is turned ON again. The signal output from the integrator 20 is converted into a digital signal by an AD converter (which will be described later) and the photoelectric conversion device 3 outputs the digital signal. Note that the first constant current source 311 is connected to the output line 30, and the photocurrent flows into the integrator 20 after a constant current $i_{B1}$ set up by the first constant current source 311 is reduced from the photocurrent output from the phototransistor 11.

Figure 21:
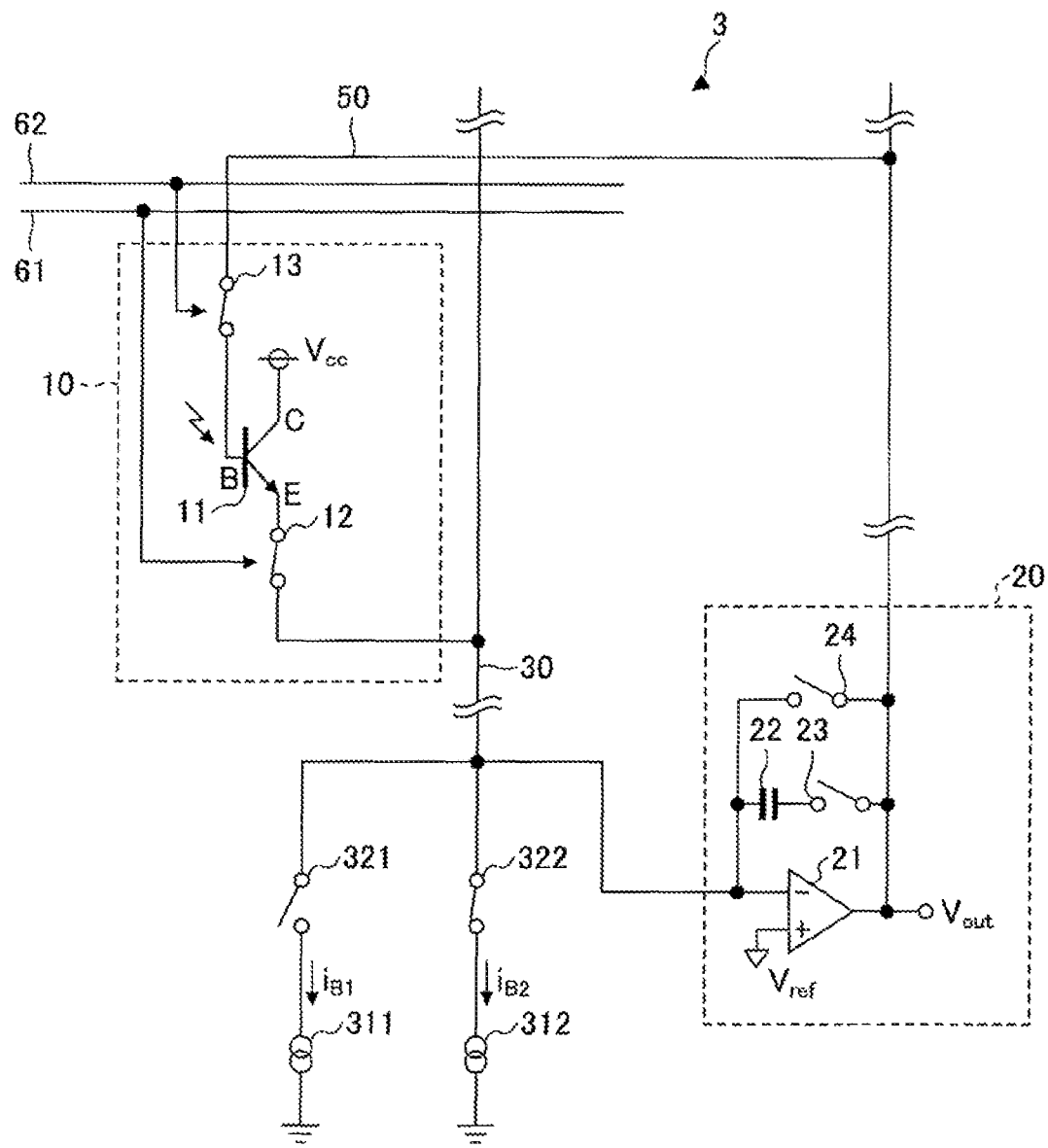
FIG. 21 is a diagram illustrating a state of the photoelectric conversion device according to the third embodiment when performing the cell reset process.

Subsequently, the photoelectric conversion device 3 performs a cell reset process to discharge the signal charge accumulated in the phototransistor 11. Specifically, the cell reset switch 13 is turned ON, the integration capacitor connect switch 23 is turned OFF, the first constant current source connect switch 321 is turned OFF, and the second constant current source connect switch 322 is turned ON (step S34). At this time, in the photoelectric conversion device 3, as illustrated in FIG. 21, the cell select switch 12 is in an ON state, the cell reset switch 13 is in an ON state, the integration capacitor connect switch 23 is in an OFF state, the integrator reset switch 24 is in an OFF state, the first constant current source connect switch 321 is in an OFF state, and the second constant current source connect switch 322 is in an ON state. Thereby, a feedback loop is formed by the base region B and the emitter region E of the phototransistor 11, the cell select switch 12, the output line 30, the operational amplifier 21 of the integrator 20, the reset line 50, and the cell reset switch 13. An electric potential of the output line 30 is controlled to be equal to the reference voltage $V_{ref}$, and the base-to-emitter voltage $V_{BE}$ of the phototransistor 11 is controlled to be equal to a value that allows the passage of a constant current $i_{B2}$ set up by the second constant current source 312 even if the phototransistor 11 has different characteristics.

Subsequently, after the process of step S34 is completed, the operation of the photoelectric conversion device 3 is returned to step S31 again, and the above-described processes of steps S31 to S34 are repeated.

According to the above-described photoelectric conversion device 3 of the third embodiment, in addition to the advantageous effects of the first embodiment, the following advantageous effect is obtained. Namely, the photoelectric conversion device 3 of the third embodiment includes the two constant current sources (the first constant current source 311 and the second constant current source 312). Hence, the current pulled when performing the cell select process, and the current pulled when performing the cell reset process may be set up arbitrarily. Specifically, the current pulled when performing the cell reset process is used to set up the initial bias state of the phototransistor 11, and the current affects the time to stabilize the initial bias state and the time to output the photocurrent. Further, the current pulled when performing the cell select process affects the dynamic range of the output of the integrator 20 and the impedance of the output line 30. Hence, the current value required for the constant current source 40 is not necessarily the same, and there may be a case in which it is preferable that the current value required when performing the cell select process is different from that when performing the cell reset process. In such a case, according to the photoelectric conversion device 3 of the third embodiment, the optimal constant current source 40 may be selected for the respective purposes.

In the third embodiment, a case in which the photoelectric conversion device 3 includes the two constant current sources (the first constant current source 311 and the second constant current source 312) has been described. However, it is to be understood that the third embodiment described above is exemplary and explanatory and is not restrictive of the invention as claimed. For example, the photoelectric conversion device 3 may include three or more constant current sources.

Fourth Embodiment

Figure 22:
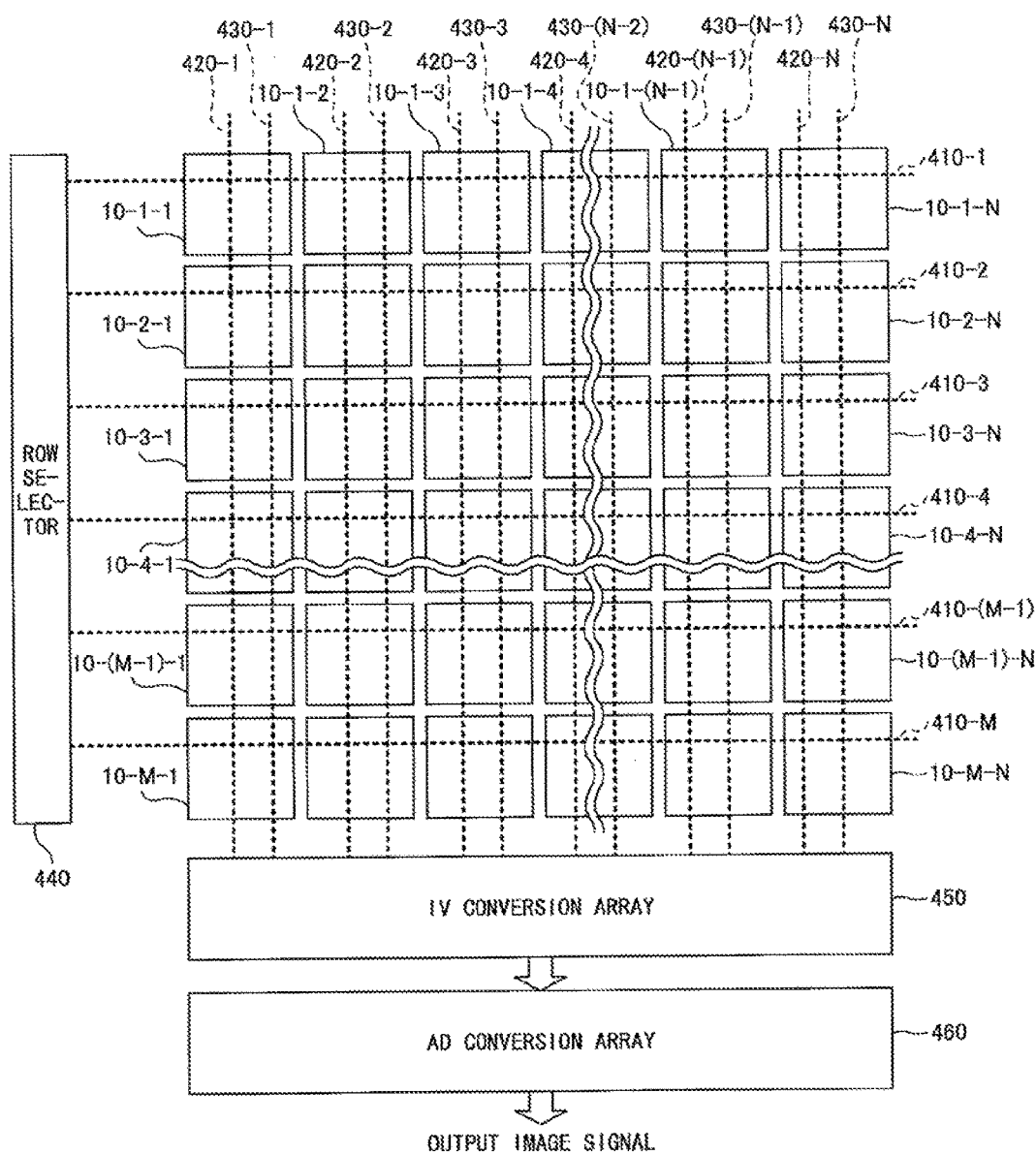
FIG. 22 is a diagram illustrating a configuration of an image generation device.

In a fourth embodiment, an image generation device in which a plurality of photoelectric conversion devices, each configured as described above, are arrayed in a two-dimensional formation will be described. FIG. 22 is a diagram illustrating a configuration of the image generation device according to the fourth embodiment.

As illustrated in FIG. 22, the image generation device includes a two-dimensional array of pixel cells 10-1-1 to 10-M-N, a plurality of row selection lines 410-1 to 410-M, a plurality of column output lines 420-1 to 420-N, a plurality of reset lines 430-1 to 430-N, a row selector 440, an IV (current-to-voltage) conversion array 450 of integrators 20, and an AD (analog-to-digital) conversion array 460 of AD converters to convert the signals output from the integrators 20 into digital signals.

Each of the pixel cells 10-1 to 10-M is connected to a corresponding one of the row selection lines 410 and further connected to a corresponding one of the column output lines 420. The pixel cells 10-1-$n$ to 10-M-$n$ connected to the row selection lines 410-1 to 410-M, respectively, are connected to a column output line 420-$n$ (1≤n≤N) of the column output lines 420-1 to 420-N.

The row selector 440 selectively activates one pixel cell 10-$m$-$n$ (1≤m≤M) of the pixel cells 10-1-$n$ to 10-M-$n$ by using the row selection lines 410-1 to 410-M. The active pixel cell 10-$m$-$n$ transfers, upon reception of an incident optical energy, the photocurrent having the magnitude according to the intensity of the incident light to the IV conversion array 450 via a corresponding column output line 420-$n$. Further, a reset potential is given to the active pixel cell 10-$m$-$n$ via a corresponding reset line 430-$n$.

The IV conversion array 450 converts the output current from each of the pixel cells 10 into the output voltage.

The AD conversion array 460 performs the analog-to-digital conversion of the output voltages of the IV conversion array 450 to generate an output image signal.

Note that a pair of one IV conversion array 450 and one AD conversion array 460 may be arranged for every one of the columns of the two-dimensional array, or may be arranged for every two or more columns of the two-dimensional array. In these cases, the column selection function may be added to the pair of the arrays 450 and 460.

As described above, the image generation device of the fourth embodiment is configured so that a plurality of photoelectric conversion devices each according to any of the first through third embodiments are arrayed in a two-dimensional formation. Hence, the reading time may be reduced, and therefore the image generation speed may be increased.

According to the above-described embodiments, it is possible to provide a photoelectric conversion device which is able to reduce the time needed to reset the electric charge accumulated in the phototransistor.

The photoelectric conversion device according to the present disclosure is not limited to the above-described embodiments, and variations and modifications may be made without departing from the scope of the present disclosure.

What is claimed is:
1. A photoelectric conversion device comprising:
a photoelectric conversion unit including a phototransistor having a collector region, an emitter region, and a base region to generate an output current according to an intensity of incident light to the phototransistor; and
a base potential setting unit including a constant current source to set up a base potential of the phototransistor so that the output current that flows from the phototransistor, when the constant current source is connected to the emitter region of the phototransistor in response to a control signal received by the base potential setting unit, is equal to a predetermined current value, wherein the base potential setting unit is connected to the base region of the phototransistor and includes a reset line to reset the phototransistor, the photoelectric conversion unit comprises a switch configured to connect the base region to the reset line and disconnect the base region from the reset line, the base potential setting unit comprises an operational amplifier configured to receive the current output from the photoelectric conversion unit, and the reset line is connected to an output of the operational amplifier.

2. The photoelectric conversion device according to claim 1, wherein:

the base potential setting unit comprises an integrator configured to perform an integration process of the current output from the photoelectric conversion unit, the integration process accumulating electric charge according to the current within a predetermined time, converting the accumulated charge into a voltage, and outputting the voltage; and the reset line is connected to an output of the integrator.

3. The photoelectric conversion device according to claim 1, wherein a plurality of photoelectric conversion units, each including the phototransistor, are arrayed in a two-dimensional formation.

4. An image generation device comprising:

the photoelectric conversion device of claim 1; and an AD (analog-to-digital) converter configured to convert the output current from the photoelectric conversion device into a digital signal.

5. The image generation device according to claim 4, wherein:

the base potential setting unit comprises an integrator configured to perform an integration process of the current output from the photoelectric conversion unit, the integration process accumulating electric charge according to the current within a predetermined time, converting the accumulated charge into a voltage, and outputting the voltage; and the reset line is connected to an output of the integrator.

6. The image generation device according to claim 4, wherein the base potential setting unit comprises:

two or more constant current sources each connectable to the emitter region of the phototransistor; and a switch unit configured to be switched between a first connection state in which one of the constant current sources is connected to the emitter region to enable the base potential setting unit to set up the base potential and a second connection state in which another of the constant current sources is connected to the emitter region to disable the base potential setting unit from setting up the base potential.

7. The image generation device according to claim 4, wherein a plurality of photoelectric conversion units, each including the phototransistor, are arrayed in a two-dimensional formation.

8. A photoelectric conversion device comprising:

a photoelectric conversion unit including a phototransistor having a collector region, an emitter region, and a base region to generate an output current according to an intensity of incident light to the phototransistor; and a base potential setting unit configured to set up a base potential of the phototransistor so that the output current from the photoelectric conversion unit is equal to a predetermined current value, wherein the base potential setting unit comprises:

two or more constant current sources each connectable to the emitter region of the phototransistor; and a switch unit configured to be switched between a first connection state in which one of the constant current sources is connected to the emitter region to enable the base potential setting unit to set up the base potential and a second connection state in which another of the constant current sources is connected to the emitter region to disable the base potential setting unit from setting up the base potential.

9. A photoelectric conversion device comprising:

a photoelectric conversion unit including a phototransistor having a collector region, an emitter region, and a base region, to generate and collect a signal charge according to an intensity of light to the phototransistor and to output, in response to a control signal, an output current to discharge the signal charge collected in the phototransistor; and a base potential setting unit configured to set up a base potential of the phototransistor so that the output current from the photoelectric conversion unit is equal to a predetermined current value, wherein during a reset process to discharge the signal charge collected in the phototransistor, each of the base region of the phototransistor and the emitter region of the phototransistor is connected to the base potential setting unit in a feedback loop, the base potential setting unit is connected to the base region of the phototransistor and includes a reset line to reset the phototransistor, the photoelectric conversion unit comprises a switch configured to connect the base region to the reset line and disconnect the base region from the reset line, the base potential setting unit comprises an operational amplifier configured to receive the current output from the photoelectric conversion unit, and the reset line is connected to an output of the operational amplifier.

* * * * *